United States Patent
Ma et al.

(10) Patent No.: US 12,556,164 B2
(45) Date of Patent: Feb. 17, 2026

(54) CONDITIONAL ACTIVE THERMAL CONTROL TO INCREASE POWER SEMICONDUCTOR LIFETIME AND EFFICIENCY

(71) Applicant: Infineon Technologies Austria AG, Villach (AT)

(72) Inventors: Kwok Wai Ma, Singapore (SG); Dinesh Palaniappan, Singapore (SG)

(73) Assignee: Infineon Technologies Austria AG, Villach (AT)

( * ) Notice: Subject to any disclaimer, the term of this patent is extended or adjusted under 35 U.S.C. 154(b) by 221 days.

(21) Appl. No.: 18/339,795

(22) Filed: Jun. 22, 2023

(65) Prior Publication Data

US 2024/0429899 A1 Dec. 26, 2024

(51) Int. Cl.
H03K 3/011 (2006.01)
H02P 27/08 (2006.01)
H03K 17/14 (2006.01)

(52) U.S. Cl.
CPC .......... *H03K 3/011* (2013.01); *H03K 17/145* (2013.01); *H02P 27/08* (2013.01)

(58) Field of Classification Search
CPC ........ H03K 3/011; H03K 17/145; H02P 27/08
See application file for complete search history.

(56) References Cited

U.S. PATENT DOCUMENTS

| | | | |
|---|---|---|---|
| 10,389,108 B2 * | 8/2019 | Duvnjak | H02M 1/08 |
| 10,897,247 B2 * | 1/2021 | Marques Martins | H03K 17/28 |
| 11,146,258 B2 * | 10/2021 | Norling | H03K 17/0828 |

OTHER PUBLICATIONS

Van der Broeck, et al., "Methodology for Active Thermal Cycle Reduction of Power Electronic Modules," IEEE Transactions on Power Electronics, vol. 34, No. 8, Aug. 2019, pp. 8213-8229.
Wu, et al., "Temperature adaptive IGBT gate-driver design," 6 pages.
Ruthardt, et al., "Model Based Junction Temperature Control Using the Gate Driver Voltage as a Correction Variable," EPE'19 ECCE Europe, 8 pages.
Bayerer, et al., "Model for Power Cycling lifetime of IGBT Modules—various factors influencing lifetime," 6 pages.
Kolar, et al., "Influence of the Modulation Method on the Conduction and Switching Losses of a PWM Converter System," IEEE Transactions on Industry Applications, vol. 27, No. 6, Nov./Dec. 1991, pp. 1063-1075.

* cited by examiner

*Primary Examiner* — Menatoallah Youssef
*Assistant Examiner* — Colleen J O Toole
(74) *Attorney, Agent, or Firm* — Harrity & Harrity, LLP

(57) ABSTRACT

A gate driver system includes an active thermal control (ATC) circuit that monitors load current changes of a load current conducted by a transistor, and enables or disables an ATC of the transistor based on the load current changes. The ATC circuit is configured to evaluate load current changes that satisfy a duration threshold as qualified load current changes. The ATC circuit is configured to detect a direction and a magnitude of a qualified load current change, compare the magnitude of the qualified load current change to a threshold, and enable the ATC of the transistor if the qualified load current change has a decreasing direction and the magnitude of the qualified load current change satisfies the threshold. The ATC circuit is configured to regulate, while the ATC is enabled, a power dissipation parameter to regulate a power dissipation of the transistor.

21 Claims, 8 Drawing Sheets

500A ⟶

| Power Dissipation parameter | | Control mode | | |
|---|---|---|---|---|
| | | Two-steps | Multi-steps | Continuous variable |
| $R_G$ | Gate resistance | Y | Y | Y |
| $f_{SW}$ | Switching frequency | Y | Y | Y |
| $V_G$ | Gate voltage | Y | Y | Y |
| $M_{PWM}$ | Modulation scheme | Y | N | N |

Power dissipation parameters and control mode
for different ATC techniques

| Power Dissipation parameter for Two-Step control | | Value | |
|---|---|---|---|
| | | Low-loss mode | High-loss mode |
| $R_G$ | Gate resistance | $R_{G,Lo}$ | $R_{G,Hi}$ |
| $f_{SW}$ | Switching frequency | $f_{SW,Lo}$ | $f_{SW,Hi}$ |
| $V_G$ | Gate voltage | $V_{G,Hi}$ | $V_{G,Lo}$ |
| $M_{PWM}$ | Modulation scheme | $M_{Lo}$ | $M_{Hi}$ |

| Device power dissipation ($I_O$) | $P_{D,Lo}(I_O)$ | $P_{D,Hi}(I_O)$ |
|---|---|---|
| Operation duration | $T_{Lo}$ | $T_{Hi}$ |
| $D_{ATC}$ (% of hi-loss mode operation) | $=T_{Hi}/(T_{Hi}+T_{Lo})$ | |

Power dissipation parameters, power dissipation,
and modulation control for Two-Step ATC

FIG. 5B

CONDITIONAL ACTIVE THERMAL CONTROL TO INCREASE POWER SEMICONDUCTOR LIFETIME AND EFFICIENCY

BACKGROUND

Many functions of modern devices in automotive, consumer, and industrial applications, such as driving an electric motor or an electric machine, rely on power semiconductor devices. For example, insulated gate bipolar transistors (IGBTs), metal oxide semiconductor field effect transistors (MOSFETs), and diodes, to name a few, have been used for various applications including, but not limited to, switches in power supplies and power converters.

A transistor typically comprises a semiconductor structure configured to conduct a load current along a load current path between two load terminal structures of the transistor. Further, the load current may be controlled by a control electrode, sometimes referred to as a gate electrode, of the transistor. For example, upon receiving a corresponding control signal from, for example, a gate driver, the control electrode may set its transistor in one of a conducting state or a blocking state. Accordingly, the semiconductor structure behaves like a switch with on and off states (i.e., conducting and blocking states, respectively).

Usually, a power inverter is composed of two complementary transistors (e.g., a high-side transistor and a low-side transistor) for each motor phase, where the two complementary transistors form a half-bridge to drive an output pad connected to a motor winding. A gate driver, used for driving the two complementary transistors, may be supplied with a fixed positive voltage by a positive supply rail and a fixed negative voltage by a negative supply rail. The positive supply rail may be connected to the output pad via the high-side transistor of the two complementary transistors to supply load current to the motor winding, and the negative supply rail may be connected to the output pad via the low-side transistor of the two complementary transistors to sink load current from the motor winding. The two complementary transistors may be complementarily turned on and off to avoid cross-conduction.

Accordingly, the load current, also referred to as a motor phase current, may be controlled by driving the two complementary transistors. The amplitude of the control signal received from the gate driver for each transistor may be varied to drive the two complementary transistors between switching states. This, in turn, drives the motor. For example, a gate-source voltage Vgs of a MOSFET is typically driven down to approximately zero to turn off the MOSFET and is typically driven to a maximum value to fully turn on the MOSFET. For this reason, the gate-source voltage Vgs may be referred to as a control voltage.

During a running operation, a motor may be driven according to a motor control algorithm to achieve a desired motor speed corresponding to an electrical frequency of the control signals.

SUMMARY

In some implementations, a gate driver system includes a gate driver configured to be coupled to a control terminal of a transistor and configured to control a control voltage applied to the control terminal in order to drive the transistor between switching states; and an active thermal control circuit configured to monitor load current changes of a load current conducted by the transistor in a conduction state, and enable or disable an active thermal control of the transistor based on the load current changes, wherein the active thermal control circuit is configured to evaluate load current changes that satisfy a duration threshold as qualified load current changes, wherein the active thermal control circuit is configured to detect a direction of a qualified load current change of the qualified load current changes, wherein the direction of the qualified load current change is an increasing direction or a decreasing direction, wherein the active thermal control circuit is configured to detect a magnitude of the qualified load current change of the qualified load current changes, and compare the magnitude to a first threshold, wherein the active thermal control circuit is configured to enable the active thermal control of the transistor if the qualified load current change has the decreasing direction and the magnitude of the qualified load current change satisfies the first threshold, wherein the active thermal control circuit is configured to regulate, while the active thermal control is enabled, a power dissipation parameter to regulate a power dissipation of the transistor, and wherein, while the active thermal control is disabled, the active thermal control circuit is configured to not regulate the power dissipation parameter.

In some implementations, a gate driver system includes a gate driver configured to be coupled to the control terminal of a transistor and configured to control a control voltage applied to the control terminal in order to drive the transistor between switching states; and an active thermal control circuit configured to monitor a load current conducted by the transistor in a conduction state, and enable or disable an active thermal control of the transistor based on the load current, wherein the active thermal control circuit is configured to determine an average load current of the load current and evaluate load current changes of the average load current, wherein evaluating the load current changes of the average load current includes: detecting a direction of a load current change of the average load current, wherein the direction of the load current change is an increasing direction or a decreasing direction, detecting a magnitude of the load current change of the average load current, and comparing the magnitude of the load current change to a first threshold, wherein, the active thermal control circuit is configured to enable the active thermal control of the transistor if the load current change has the decreasing direction and the magnitude of the load current change satisfies the first threshold, and wherein, the active thermal control circuit is configured to, while the active thermal control is enabled, regulate a power dissipation parameter to regulate a power dissipation of the transistor, and wherein, while the active thermal control is disabled, the active thermal control circuit is configured to not regulate the power dissipation parameter.

In some implementations, a method of driving a transistor between switching states includes monitoring load current changes of a load current conducted by the transistor in a conduction state; enabling or disabling an active thermal control of the transistor based on the load current changes; evaluating load current changes that satisfy a duration threshold as qualified load current changes; detecting a direction of a qualified load current change of the qualified load current changes, wherein the direction of the qualified load current change is an increasing direction or a decreasing direction; detecting a magnitude of the qualified load current change of the qualified load current changes; comparing the magnitude to a first threshold; and enabling the active thermal control of the transistor if the qualified load current change has the decreasing direction and the magnitude of the qualified load current change satisfies the first threshold, wherein, while the active thermal control is enabled, an active thermal control circuit is enabled to regulate a power dissipation parameter to regulate a power dissipation of the transistor, and wherein, while the active thermal control is disabled, the active thermal control circuit is disabled such that the power dissipation parameter is not regulated by the active thermal control circuit.

BRIEF DESCRIPTION OF THE DRAWINGS

Implementations are described herein making reference to the appended drawings.

FIG. 5A illustrates a table showing different control modes for ATC and corresponding power dissipation parameters, including gate resistance, switching frequency, gate voltage, and modulation scheme.

FIG. 5B illustrates a table showing power dissipation parameters, including gate resistance, switching frequency, gate voltage, and modulation scheme, that may be used during a two-step control mode for ATC.

DETAILED DESCRIPTION

Figure 1:
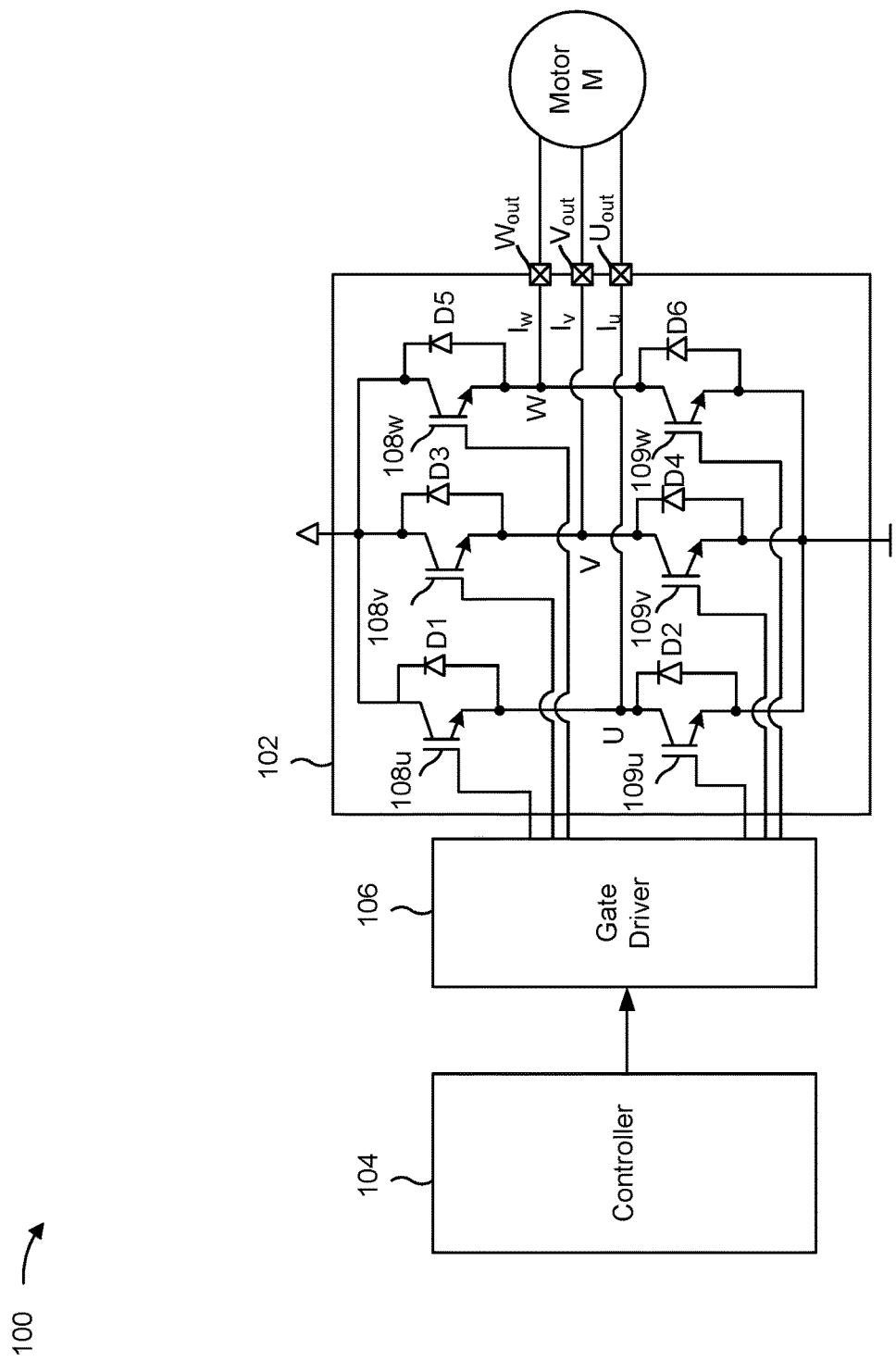
FIG. 1 illustrates a schematic block diagram illustrating a motor control system according to one or more implementations.

In the following, details are set forth to provide a more thorough explanation of example implementations. However, it will be apparent to those skilled in the art that these implementations may be practiced without these specific details. In other instances, well-known structures and devices are shown in block diagram form or in a schematic view, rather than in detail, in order to avoid obscuring the implementations. In addition, features of the different implementations described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually interchangeable.

Each of the illustrated x-axis, y-axis, and z-axis is substantially perpendicular to the other two axes. In other words, the x-axis is substantially perpendicular to the y-axis and the z-axis, the y-axis is substantially perpendicular to the x-axis and the z-axis, and the z-axis is substantially perpendicular to the x-axis and the y-axis. In some cases, a single reference number is shown to refer to a surface, or fewer than all instances of a part may be labeled with all surfaces of that part. All instances of the part may include associated surfaces of that part despite not every surface being labeled.

The orientations of the various elements in the figures are shown as examples, and the illustrated examples may be rotated relative to the depicted orientations. The descriptions provided herein, and the claims that follow, pertain to any structures that have the described relationships between various features, regardless of whether the structures are in the particular orientation of the drawings, or are rotated relative to such orientation. Similarly, spatially relative terms, such as "top," "bottom," "below," "beneath," "lower," "above," "upper," "middle," "left," and "right," are used herein for ease of description to describe one element's relationship to one or more other elements as illustrated in the figures. The spatially relative terms are intended to encompass different orientations of the element, structure, and/or assembly in use or operation in addition to the orientations depicted in the figures. A structure and/or assembly may be otherwise oriented (rotated 90 degrees or at other orientations), and the spatially relative descriptors used herein may be interpreted accordingly. Furthermore, the cross-sectional views in the figures only show features within the planes of the cross-sections, and do not show materials behind the planes of the cross-sections, unless indicated otherwise, in order to simplify the drawings.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In implementations described herein or shown in the drawings, any direct electrical connection or coupling (e.g., any connection or coupling without additional intervening elements) may also be implemented by an indirect connection or coupling (e.g., a connection or coupling with one or more additional intervening elements, or vice versa) as long as the general purpose of the connection or coupling (e.g., to transmit a certain kind of signal or to transmit a certain kind of information) is essentially maintained. Features from different implementations may be combined to form further implementations. For example, variations or modifications described with respect to one of the implementations may also be applicable to other implementations unless noted to the contrary.

As used herein, the terms "substantially" and "approximately" mean "within reasonable tolerances of manufacturing and measurement." For example, the terms "substantially" and "approximately" may be used herein to account for small manufacturing tolerances or other factors (e.g., within 5%) that are deemed acceptable in the industry without departing from the aspects of the implementations described herein. For example, a resistor with an approximate resistance value may practically have a resistance within 5% of the approximate resistance value. As another example, a signal with an approximate signal value may practically have a signal value within 5% of the approximate signal value.

In the present disclosure, expressions including ordinal numbers, such as "first", "second", and/or the like, may modify various elements. However, such elements are not limited by such expressions. For example, such expressions do not limit the sequence and/or importance of the elements. Instead, such expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

A transistor can be referred to as a power switch, a logic switch, or a transistor switch that may be used to drive a current, such as a load current. In particular, a power transistor is a power semiconductor device that may be used to drive a load current. The power transistor includes a first load terminal (e.g., a source or an emitter) and a second load terminal (e.g., a drain or a collector). Additionally, a load current path of the power transistor may be controlled by a control electrode, sometimes referred to as a gate, connected to a control terminal of the power transistor. A load current path of the power transistor is a gate-controlled conductive channel whose conductivity may be controlled by a control voltage applied to the control electrode of the power transistor. For example, the power transistor can be turned on or off by activating and deactivating its control electrode. For example, applying a positive voltage across a gate and a source of a MOSFET will keep the MOSFET in its "on" state, while applying a voltage of approximately zero or slightly negative across the gate and the source of the MOSFET will cause the MOSFET to turn "off."

There is a turn-on process and a turn-off process for switching a transistor on and off. During the turn-on process of an n-channel transistor, a gate driver may be used to provide (source) a gate current (e.g., an ON current) to a gate of the n-channel transistor in order to charge a gate voltage to a sufficient voltage to turn on the n-channel transistor. In contrast, during the turn-off process of the n-channel transistor, the gate driver is used to draw (sink) a gate current (e.g., an OFF current) from the gate of the n-channel transistor in order to discharge the gate voltage sufficiently to turn off the n-channel transistor. A voltage pulse may be output from the gate driver as a control signal according to a pulse-width modulation (PWM) scheme. Thus, the control signal may be switched between an ON voltage level and an OFF voltage level during a PWM cycle for controlling the n-channel transistor. This in turn charges and discharges the gate voltage to turn on and off the n-channel transistor, respectively.

The opposite is true for a p-channel transistor. The gate driver may be used to draw (sink) a gate current (e.g., an ON current) from a gate of the p-channel transistor in order to discharge the gate voltage to a sufficient voltage to turn on the p-channel transistor. In contrast, during the turn-off process of the p-channel transistor, the gate driver is used to provide (source) a gate current (e.g., an OFF current) to the gate of the p-channel transistor in order to charge the gate voltage of the p-channel transistor sufficiently to turn off the p-channel transistor. A control signal applied to the gate of the p-channel transistor may be switched between an ON voltage level and an OFF voltage level during a PWM cycle for controlling the p-channel transistor. This in turn charges and discharges the gate voltage to turn on and off the p-channel transistor, respectively.

For both n-channel and p-channel transistors, the n-channel and p-channel transistors are off when the gate-source voltage Vgs is approximately a zero value or below a threshold voltage and the n-channel and p-channel transistors are on when the gate-source voltage Vgs is equal to or greater than the threshold voltage.

For driving a load in this manner, two transistors are typically arranged in a half-bridge configuration, including a high-side transistor and a low-side transistor. The high-side transistor may be a p-channel transistor connected to a high-side supply potential and the low-side transistor may be an n-channel transistor connected to a low-side supply potential. In some implementations, the high-side transistor and the low-side transistor may be of a same transistor type (e.g., both n-channel type or both p-channel type).

A load current is said to be a positive load current when the load current is flowing from a half-bridge toward the load, and a load current is said to be negative when the load current is flowing away from the load toward the half-bridge. A high-side transistor, when on, is responsible for conducting a positive load current in order to source the load current to the load while its complementary, low-side transistor is turned off (e.g., the low-side transistor is in blocking or high impedance mode). In order to sink load current from the load, the roles of the high-side and low-side transistors are reversed. Here, the low-side transistor, when on, is responsible for conducting a negative load current in order to sink the load current from the load while its complementary, high-side transistor is turned off (e.g., the high-side transistor is in blocking or high impedance mode). The two complementary transistors are typically switched such that both are not turned on at the same time.

Transistors may include IGBTs and MOSFETs (e.g., Si MOSFETs or SiC MOSFETs), among other examples. It will be appreciated that one type of transistor may be substituted for another type of transistor. In this context, when substituting a MOSFET for an IGBT, the MOSFET's drain may be substituted for the IGBT's collector, the MOSFET's source may be substituted for the IGBT's emitter, the MOSFETs drain-source voltage Vds may be substituted for the IGBT's collector-emitter voltage Vce, and the MOSFET's gate-source voltage Vgs may be substituted for the IGBT's gate-emitter voltage Vge, or vice versa, in any one of the examples described herein.

Some implementations described in this disclosure pertain to, without being limited thereto, half-bridges used for driving electric motors. For example, a multi-phase inverter, as a type of power inverter, is configured to provide multi-phase power by supplying multiple phase loads (e.g., a three-phase motor). For instance, three-phase power involves three symmetrical sine waves that are 120 electrical degrees out of phase with one another. In a symmetric three-phase power supply system, three conductors each carry an alternating current (AC) of the same frequency and voltage amplitude relative to a common reference but with a phase difference of one third of a driving cycle. Due to the phase difference, a voltage on any of the three conductors reaches its voltage peak at one third of the driving cycle, with the voltage peaks of the three conductors being distributed from each other within the driving cycle with a substantially equal phase delay. This phase delay gives constant power transfer to a balanced linear load. It also makes it possible to produce a rotating magnetic field in an electric motor.

A three-phase inverter includes three inverter legs, one for each of the three phases, and each inverter leg is connected to a direct current (DC) voltage source in parallel to each other. Each inverter leg includes a pair of transistors arranged in a half-bridge configuration for converting DC to AC, for driving a phase load, as described above. However, multi-phase inverters are not limited to three phases, and may include two phases or more than three phases, with an inverter leg for each phase. In some instances, two half-bridges may be connected as an H-bridge circuit with the load (e.g., the motor) connected as a crossbar between the two half-bridges as a single-phase load.

A power cycling lifetime Nf of a transistor may be determined by a thermal stress to different package layers resultant from a periodic change of a junction temperature Tj of the transistor, among other factors. For applications with expected large load changes (e.g., traction control, electric vehicles, and wind power), control and reduction of an amplitude of a junction temperature change $\Delta Tj$ of the transistor is important to extend a lifetime of the transistor. The junction temperature change $\Delta Tj$ may be caused by a power dissipation change $\Delta P_D$ of the transistor, which may be caused by load current changes $\Delta Io$ in the load current that are caused by changes in the load.

While load current changes $\Delta Io$ may not be controllable in all instances, if a system efficiency can be controlled to reduce the power dissipation change $\Delta P_D$ of the transistor, the junction temperature change $\Delta Tj$ of the transistor can also be reduced such that the power cycling lifetime Nf of the transistor can be increased. Active thermal control (ATC) techniques may be used to regulate the power dissipation change $\Delta P_D$ of the transistor, and thus the junction temperature change $\Delta Tj$ of the transistor, by controlling the system efficiency when the load current Io changes.

Some implementations disclosed herein are directed to a gate driver system with an ATC circuit that is configured to improve the system efficiency by implementing a conditional enablement and disablement of an ATC function. Instead of unconditionally and continuously enabling the ATC function, an ATC mechanism that regulates power losses (e.g., power dissipation) of the transistor is only enabled when a large junction temperature change $\Delta Tj$ is expected if certain conditions are met, in order to balance a trade-off between the system efficiency and the power cycling lifetime Nf of the transistor. For example, the ATC circuit may use the ATC mechanism (e.g., a power dissipation parameter to be regulated) to increase the power dissipation of the transistor when a large decrease in the load current is detected, which large decrease in load current would result would result in a large decrease in the junction temperature Tj. Thus, the ATC circuit may enable an ATC of the transistor to increase the power dissipation of the transistor in order to reduce the junction temperature change $\Delta Tj$ that would otherwise occur during the large decrease in the load current. However, increasing the power dissipation of the transistor decreases the system efficiency by introducing higher power losses. Thus, the ATC circuit aims to balance the trade-off between the system efficiency and the power cycling lifetime Nf of the transistor by using a conditional enablement of the ATC function only when a large degradation to the power cycling lifetime Nf of the transistor is expected, based on certain enablement conditions being satisfied.

The power dissipation of the transistor can be regulated by controlling one or more power dissipation parameters, including a gate drive resistance Rg, a gate drive voltage Vg, a switching frequency of the transistor (e.g., corresponding to a switching frequency $f_{sw}$ of a PWM control signal), or a PWM scheme $M_{PWM}$ of the PWM control signal used for controlling the switching state of the transistor. For example, the power dissipation of the transistor can be increased by increasing the gate drive resistance Rg, reducing the gate drive voltage Vg, increase switching frequency $f_{sw}$ of the PWM control signal, or changing PWM scheme $M_{PWM}$ of the PWM control signal to a less efficient modulation scheme (e.g., space vector PWM). The ATC circuit may enable the ATC of the transistor in order to regulate one or more of the power dissipation parameters in response to detecting certain enablement conditions. In addition, the ATC circuit may disable the ATC of the transistor such that the ATC circuit does not regulate any of the power dissipation parameters in response to detecting certain disablement conditions.

One criterion used for determining whether certain enablement conditions and/or certain disablement conditions have been met is a duration of a load change. A dynamic thermal performance of a power semiconductor package and heatsink will determine how the junction temperature Tj will respond to changes of the load current Io and changes in the power dissipation $P_D$ of the transistor, which are given mathematically by Equations 1 and 2:

$$\Delta T_{JC} = Z_{thJC} * \Delta P_D, \quad (1)$$

$$\Delta T_{CA} = Z_{thCA} * \Delta P_D, \quad (2)$$

where $\Delta T_{JC}$ is a change in the junction temperature Tj that is allocated to the dynamic thermal performance of a semiconductor junction-to-case, $\Delta T_{CA}$ is a change in the case temperature Tc that is allocated to the dynamic thermal performance of the heatsink, $Z_{thJC}$ is a transient thermal impedance of the semiconductor junction-to-case, and $Z_{thCA}$ is a transient thermal impedance of the heatsink. $Z_{thJC}$ and $Z_{thCA}$ can be specified by a Cauer model or a Foster model, which is a series of low-pass filters with different time constants for converting the power dissipation change $\Delta P_D$ of the transistor to the junction temperature change $\Delta Tj$. Therefore, fast changes of the power dissipation change $\Delta P_D$ may be filtered out by $Z_{thJC}$ and $Z_{thCA}$, and only slow changes of the power dissipation change $\Delta P_D$ may appear as the junction temperature change $\Delta Tj$. To avoid an unnecessary increase of semiconductor power dissipation, the ATC of the transistor should only be enabled when a duration of the power dissipation change $\Delta P_D$ is longer than a certain time constant t, which may be set comparable to a slowest time constant in $Z_{thJC}$ and $Z_{thCA}$. Here, fast changes are filtered out according to the time constant t of a low-pass filter, whereas slow changes are passed through according to the time constant t of the low-pass filter.

Since the junction temperature change $\Delta Tj$ and power cycling lifetime Nf follow an inverse power law, the ATC of the transistor may be conditionally enabled only for large load changes instead of small load changes, such that additional power losses from the ATC circuit are used only to mitigate large load changes that significantly consume the power cycling lifetime Nf of the transistor. Therefore, the ATC of the transistor should only be enabled when a magnitude of a load change (e.g., a magnitude of the load current change $\Delta Io$) exceeds a certain threshold $\Delta Io,Th$.

To meet the conflicting requirements of increasing the power cycling lifetime Nf and increasing system efficiency simultaneously, criteria to turn-on and turn-off the ATC of the transistor may be established as follows. If the output load increases significantly (e.g., if the increasing load current change $\Delta Io$ is large) from a low level and remains at a high level for at least a duration threshold (e.g. a time threshold), the ATC of the transistor should be turned off or maintained in an off-state for the system to operate in a low-loss mode to minimize or avoid unnecessary power loss. If the output load decreases significantly (e.g., if the decreasing load current change $\Delta Io$ is large) from a high level and remains at a low level for at least the duration threshold, the ATC of the transistor should be turned on to reduce the power dissipation change $\Delta P_D$, and thus to reduce the junction temperature change $\Delta Tj$ or to keep the junction temperature Tj unchanged.

In some implementations, the load current change $\Delta Io$ may be monitored by measuring an average of the load current (e.g., an average load current) and monitoring the changes of the average load current. For example, combined conditions of duration and magnitude of average load changes to turn-on (enable) and turn-off (disable) the ATC of the transistor may include: (1) when the ATC of the transistor is in an off-state, an average load current decrease $\Delta Io$ with a magnitude and a duration greater than a load current change threshold $\Delta Io,Th$ and a time constant t, respectively, is needed to turn-on the ATC of the transistor, and (2) when the ATC of the transistor is in an on-state, an average load current increase $\Delta Io$ with a magnitude and a duration greater than a load current change threshold $\Delta Io,Th$ and a time constant t, respectively, is needed to turn-off the ATC of the transistor.

In some implementations, the conditions can be further refined to reduce the junction temperature change $\Delta Tj$ by dynamically setting a load current threshold for turn-off of the ATC. For example, the load current threshold for turn-off of the ATC circuit may be adjusted each time the ATC of the transistor is enabled. The load current threshold for turn-off of the ATC of the transistor may be set to an averaged value of the load current sampled at a trigger time at which an enabling of the ATC is triggered by the ATC circuit. Thus, the ATC circuit may be configured to enable the ATC when the average load current exceeds the dynamic load current threshold for turn-off of the ATC.

FIG. 1 illustrates a schematic block diagram illustrating a motor control system 100 according to one or more implementations. In particular, the motor control system 100 includes a power inverter 102, a controller 104, and a gate driver 106. The controller 104 and the gate driver 106 operate together as a motor control unit. In some implementations, the motor control unit may be a monolithic integrated circuit (IC) with the controller 104 and the gate driver 106 being arranged on a single IC. In some implementations, the motor control unit may be divided into two or more ICs, for example, with the controller 104 being arranged on a first IC and the gate driver 106 being arranged on one or more second ICs. It will be appreciated that, while implementations described herein are directed to driving a motor, the concepts described herein may be extended to other types of inductive loads and are not limited to motors.

The motor control system 100 is further coupled to a motor M (e.g., a permanent magnet synchronous motor (PMSM) as a type of AC motor), that includes three phases U, V, and W. The power inverter 102 in this example is a three-phase voltage generator configured to provide three-phase power by supplying three phase voltages to drive the motor M.

Deviations in both magnitude and phase may cause a loss in power and torque in the motor M. Therefore, the controller 104 may be configured to monitor and control the magnitude and phase of the voltages supplied to the motor M in real-time to ensure that the proper current balance is maintained based on a feedback control loop.

The power inverter 102 for the motor M includes a switching array of six transistors 108u, 108v, 108w, 109u, 109v, and 109w arranged in complementary pairs. Each complementary pair forms a half-bridge circuit and constitutes one inverter leg that supplies a phase voltage to the motor M. Thus, each inverter leg includes a high-side transistor 108u, 108v, or 108w and a low-side transistor 109u, 109v, or 109w. Additionally, each transistor 108u, 108v, 108w, 109u, 109v, and 109w may be connected antiparallel to a corresponding freewheeling diode D1-D6. The freewheeling diodes D1-D6 provide an alternative current path for the load current during turn off of a respective transistor 108u. 108v. 108w, 109u, 109v, and 109w for current commutation. For example, the freewheeling diode D1 provides an alternative current path with respect to the low-side transistor 109u during the turn off of the low-side transistor 109u. Similarly, the freewheeling diode D2 provides an alternative current path with respect to the high-side transistor 108u during the turn off of the high-side transistor 108u.

Load current paths U. V. and W extend from an output pad Uout, Vout, or Wout of each inverter leg (e.g., the output of each half-bridge circuit) located between complementary transistors and are configured to be coupled to a load, such as the motor M. Each load current path U. V, and W carries a corresponding phase current Iu, Iv, and Iw. Each phase current Iu, Iv. and Iw has an AC electrical frequency that directly corresponds to the actual motor speed of the motor M.

The power inverter 102 is coupled to a DC power supply (e.g., a battery or a diode bridge rectifier) and to the gate driver 106.

The controller 104, which may be a microcontroller or another hardware-based controller, performs a motor control function of the motor control system 100 in real-time (or near real-time) and transmits PWM control signals to a gate driver 106. The controller 104 may employ a PWM scheme for controlling the state of each transistor, and, ultimately, each phase current provided on the respective load current paths U, V, and W. The gate driver 106 generates driver signals based on the PWM control signals for controlling the switching states (e.g., on and off states) of the transistors 108u, 108v, 108w, 109u, 109v, and 109w. Thus, load current paths U, V, and W may be controlled by the controller 104 and the gate driver 106 by controlling the control electrodes (e.g., gate electrodes) of the transistors 108u, 108v, 108w, 109u, 109v, and 109w. For example, upon receiving a PWM control signal from the controller 104, the gate driver 106 may set a corresponding transistor 108u, 108v, 108w, 109u, 109v, or 109w in one of a conducting state (e.g., on-state) or a blocking state (e.g., off-state).

The gate driver 106 may include one or more gate drivers for driving the transistors 108u, 108v, 108w, 109u, 109v, and 109w between switching states. For example, the gate driver 106 may include a gate driver for each half-bridge circuit. The gate driver 106 may be configured to receive instructions, including the PWM control signals, from the controller 104, and respectively turn on and turn off the transistors 108*u*, 108*v*, 108*w*, 109*u*, 109*v*, and 109*w* in accordance with the received instructions and the control signals. For example, during the turn-on process of a transistor 108*u*, 108*v*, 108*w*, 109*u*, 109*v*, or 109*w*, the gate driver 106 may be used to provide (source) a gate current to a gate of the transistor 108*u*, 108*v*, 108*w*, 109*u*, 109*v*, or 109*w* to charge the gate. In contrast, during the turn-off process, the gate driver 106 may be used to draw (sink) a gate current from the gate of the transistor 108*u*, 108*v*, 108*w*, 109*u*, 109*v*, or 109*w* to discharge the gate.

Furthermore, the transistors 108*u*, 108*v*, 108*w*, 109*u*, 109*v*, and 109*w* of the power inverter 102 are controlled so that at no time are both high-side and low-side transistors in the same inverter leg turned on, or else the DC power supply would be shorted. This requirement may be met by the complementary operation of the transistors 108*u*, 108*v*, 108*w*, 109*u*, 109*v*, and 109*w* within an inverter leg according to a motor control algorithm. For example, during operation, the motor M may be driven according to the motor control algorithm to achieve a desired motor speed corresponding to an electrical frequency of the control signals. A dead time may be imposed by the controller 104 during which both the high-side and low-side transistors of the same inverter leg are simultaneously turned off.

As indicated above, FIG. 1 is provided merely as an example. Other examples may differ from what is described with regard to FIG. 1. For example, in some implementations, a number of motor phases may be different or two half-bridges may be connected as an H-bridge circuit. In some implementations, additional circuit components may be added without deviating from the disclosure provided above.

Figure 2:
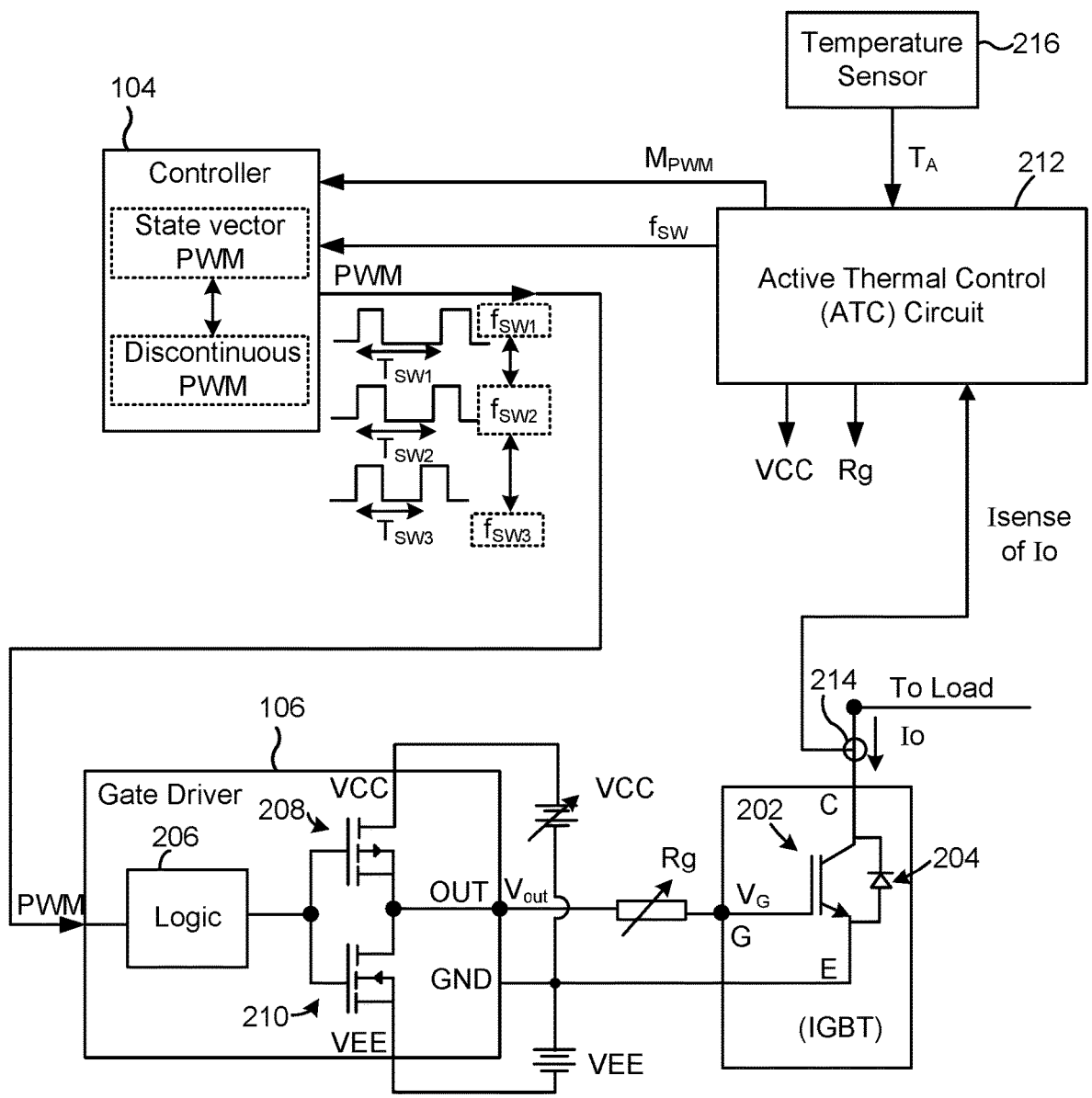
FIG. 2 illustrates a schematic block diagram of a gate driver system according to one or more implementations.

FIG. 2 illustrates a schematic block diagram of a gate driver system 200 according to one or more implementations. The gate driver system 200 may correspond to the motor control system 100 of FIG. 1, for example, when the gate driver system 200 is used to drive the motor M. The gate driver system 200 may include the controller 104, the gate driver 106, and a transistor 202 (e.g., a high-side transistor 108 or a low-side transistor 109) that is connected antiparallel to a corresponding freewheeling diode 204. While the transistor 202 is depicted as a low-side transistor in this example, a similar configuration may be used to drive a high-side transistor. Additionally, while the transistor 202 is an IGBT, the transistor could alternatively be a MOSFET in some implementations. For example, one type of voltage-controlled transistor may be substituted for another type of voltage-controlled transistor. For example, when substituting a MOSFET for an IGBT, a MOSFET's drain may be substituted for an IGBT's collector, the MOSFET's source may be substituted for the IGBT's emitter, and the MOSFETs drain-source voltage Vds may be substituted for the IGBT's collector-emitter voltage Vce in any one of the examples described herein. Thus, any IGBT may be substituted by a MOSFET, or vice versa. An IGBT is a transistor that combines an input MOSFET and an output bipolar transistor. Accordingly, an IGBT is a MOS-gated device because the IGBT is the gate of the MOSFET that controls the state of the device. Specifically, the gate-emitter voltage of an IGBT or similar device is the control voltage. Thus, both the gate-source voltage Vgs and the gate-emitter voltage Vge can be used interchangeably herein when referring to a control voltage of a voltage-controlled transistor, depending on the transistor technology. The gate driver 106 may be coupled between a control terminal and a load terminal of the transistor 202 in order to be able to apply the control voltage.

The controller 104 may be configured to generate a PWM control signal used for driving the transistor 202. The controller 104 may be configured with a plurality of PWM schemes, or simply modulation schemes, that can be used for generating the PWM control signal. For example, the controller 104 may select between a state vector PWM scheme (e.g., a high-loss modulation scheme) and a discontinuous PWM scheme (e.g., a low-loss modulation scheme) for controlling the switching states of the transistor 202. Thus, the modulation scheme may be used as a power dissipation parameter that can be varied between at least a high-loss and a low-loss setting.

Additionally, or alternatively, the controller 104 may be configured to control a switching frequency $f_{sw}$ of the PWM control signal. For example, the controller 104 may adjust the switching frequency $f_{sw}$ of the PWM control signal between three switching frequencies $f_{sw1}$, $f_{sw2}$, and $f_{sw3}$ corresponding to switching periods Tsw1, Tsw2, and Tsw3, respectively. The higher the switching frequency $f_{sw}$, the greater the power loss (power dissipation) at the transistor 202. Thus, switching frequency $f_{sw}$ may be used as a power dissipation parameter that can be varied between at least a high-loss and a low-loss setting.

In the implementation illustrated in FIG. 2, the transistor 202 includes a gate G, a collector C, and an emitter E. The gate G of the transistor 202 is a capacitive load that can be charged and discharged to modulate the gate voltage Vg, thereby modulating the gate-emitter voltage Vge. A voltage pulse may be output from the gate driver 106 as a gate control signal according to the PWM control signal. Thus, the gate control signal may be switched between an ON voltage level (e.g., high voltage) and an OFF voltage level (e.g., low voltage) during a PWM cycle for controlling the transistor 202. This in turn charges and discharges the gate capacitance to correspondingly modulate the gate voltage Vg to turn on and off the transistor 202, respectively.

Alternatively, the gate driver 106 may use sourced and sinked currents as gate control signals to turn the transistor 202 on and off. For example, during the turn-on process, the gate driver 106 may provide (source) an ON current to the gate G of the transistor 202 in order to charge the gate to a sufficient voltage to turn on the transistor 202. In contrast, during the turn-off process, the gate driver 106 is used to draw (sink) an OFF current from the gate G of the transistor 202 in order to discharge the gate voltage Vg to a sufficient voltage to turn off the transistor 202. During a turn OFF event, after some small amount of time (e.g., small compared to the PWM cycle), the gate current decreases and reaches a zero value when the gate reaches approximately a zero value or a negative value. During a turn ON event, after some small amount of time (e.g., small compared to the PWM cycle), the gate current decreases and reaches a zero value when the gate reaches the positive supply level, minus any voltage drops.

The gate driver 106 may include control logic 206, a source FET 208, and a sink FET 210 connected to the source FET 208 in a half-bridge configuration. The control logic 206 may receive the PWM control signal from a controller 104 and control the on/off states of the source FET 208 and the sink FET 210 based on the PWM control signal. For example, the control logic 206 may implement a PWM scheme for controlling the source FET 208 and the sink FET 210 based on the PWM control signal. The source FET 208 and the sink FET 210 are operated in a complementary manner such that both the source FET 208 and the sink FET 210 are not turned on simultaneously to avoid cross-conduction.

The gate driver 106 is supplied with a first supply potential VCC (e.g., a positive supply voltage) and a second supply potential VEE, which may also be connected to a ground GND of the gate driver 106. When the source FET 208 is turned on, an output pad OUT of the gate driver 106 is electrically coupled to the first supply potential VCC, and the gate driver 106 outputs an out voltage Vout at the output pad OUT that is approximately the first supply potential VCC, less any voltage drop across the source FET 208 (e.g., a driver voltage drop). When the sink FET 210 is turned on, the output pad OUT of the gate driver 106 is electrically coupled to the negative of second supply potential VEE, and the output voltage Vout at the output pad OUT is approximately the negative of second supply potential VEE. The second supply potential VEE may be equal to a ground potential or may be a positive voltage potential. In some implementations, the first supply potential VCC may be adjustable and may be adjusted to control the gate voltage Vg. For example, the first supply potential VCC may be increased to increase the gate voltage Vg and the control voltage Vge during turn-on, or may be decreased to decrease the gate voltage Vg and the control voltage Vge during turn-on. Reducing the control voltage Vge during turn-on of the transistor causes higher power losses (e.g. higher power dissipation) at the transistor 202. Thus, a voltage level of the first supply potential VCC may be used as a power dissipation parameter that can be varied between at least a high-loss and a low-loss setting.

Accordingly, the source FET 208 and the sink FET 210 operate as current sources when turned on. In particular, when turned on, the source FET 208 generates an on-current due to its connection to the first supply potential VCC. The on-current is output from the output pad Vout of the gate driver 106 and is used as a gate charging current. Thus, the source FET 208 provides an on-current to the gate G of the transistor 202 to increase the gate voltage Vg, which also causes the control voltage Vge to increase to a level above a conduction threshold (e.g., threshold voltage Vth). On the other hand, when the sink FET 210 is turned on, the sink FET 210 generates an off-current due to its connection to the second supply potential VEE. The off-current is drawn into the output pad OUT of the gate driver 106 and is used as a gate discharge current. In other words, the off-current is sinked from the gate G of the transistor 202. As a result, the gate voltage Vg decreases, which causes the control voltage Vge to decrease to a level that is below the conduction threshold (e.g., threshold voltage Vth).

The output pad OUT of the gate driver 106 is coupled to the gate G of the transistor 202 via a gate resistor Rg, which reduce the current between the output pad OUT and the gate G. A resistive value of the gate resistor Rg may be adjusted to control the power dissipation of the transistor 202. For example, a higher resistive value will slow down the turn-on and turn-off of the transistor, which leads to higher switching power losses. Thus, the resistive value of the gate resistor Rg may be used as a power dissipation parameter that can be varied between at least a high-loss and a low-loss setting.

The gate driver system 200 may further include an ATC circuit 212, a current sensor 214, and a temperature sensor 216. The current sensor 214 may be configured to sense the load current Io and generate a current sensor signal Isense that is representative of the load current Io that is conducted by the transistor 202. The current sensor 214 may include a voltage divider (e.g., a resistor network), a magnetic sensor, and any other sensor circuitry capable of sensing a current and generating the current sensor signal Isense. The temperature sensor 216 may be configured to sense an ambient temperature and generate a temperature sensor signal $T_A$ that is representative of the ambient temperature.

The ATC circuit 212 may be configured to perform a conditional ATC function based on one or more inputs. For example, the ATC circuit 212 may be configured to receive, as an input, the current sensor signal Isense and control the conditional ATC function based on the current sensor signal Isense. In addition, in some implementations, the ATC circuit 212 may be configured to receive, as another input, the temperature sensor signal $T_A$ and control the conditional ATC function based on the temperature sensor signal $T_A$. The ATC circuit 212 may be configured to enable an active thermal control of the transistor 202 if certain enablement conditions are satisfied. The ATC circuit 212 may be configured to regulate, while the active thermal control of the transistor 202 is enabled, one or more of the dissipation parameters to regulate the power dissipation of the transistor 202. Conversely, while the active thermal control of the transistor 202 is disabled, the active thermal control circuit 212 is configured to not regulate any of the power dissipation parameters, thereby leaving sole control of the power dissipation of the transistor 202 to the controller 104.

In some implementations, the ATC circuit 212 may be configured to monitor load current changes ΔIo of a load current Io conducted by the transistor in a conduction state, and enable or disable the ATC of the transistor 202 based on the load current changes ΔIo. The ATC circuit 212 may be configured to monitor the load current changes ΔIo of the load current Io by monitoring the current sensor signal Isense. Thus, the ATC circuit 212 may be configured to monitor the load current Io directly or indirectly via the current sensor signal Isense, and detect a magnitude of the load current Io.

The ATC circuit 212 may be configured to evaluate load current changes ΔIo that satisfy a duration threshold as qualified load current changes. For example, to avoid an unnecessary increase of the power dissipation of the transistor 202, the ATC circuit 212 may enable or disable the ATC of the transistor 202 only when a duration of the power dissipation change $\Delta P_D$ is longer than a certain time constant τ (e.g., longer than the duration threshold). Thus, those load current changes ΔIo that are longer than the duration threshold may be evaluated further as qualified load current changes, while those load current changes ΔIo that are not longer than the duration threshold may be filtered out from being evaluated further. For example, if a load current decrease, qualified as long and large, is detected by the ATC circuit 212, the ATC circuit 212 may enable the ATC of the transistor 202. On the other hand, if a load current increase, qualified as long and large, is detected, the ATC circuit 212 may disable the ATC of the transistor 202.

In some implementations, the ATC circuit 212 may measure an average of the load current ΔIo (e.g., an average of the current sensor signal Isense) as a way of filtering out load current changes ΔIo that are not longer than the duration threshold, and allowing load current changes ΔIo that are longer than the duration threshold to be further evaluated for determining whether the ATC of the transistor 202 should be enabled or disabled. Thus, if a decrease of the average load current, qualified as large, is detected by the ATC circuit 212, the ATC circuit 212 may enable the ATC of the transistor 202. On the other hand, if an increase of the average load current, qualified as large, is detected, the ATC circuit 212 may disable the ATC of the transistor 202.

The ATC circuit 212 may be configured to detect a direction of a qualified load current change. For example, the direction of the qualified load current change may be in an increasing direction or a decreasing direction. The ATC circuit 212 may be configured to detect a magnitude of the qualified load current change $\Delta$Io, and compare the magnitude to a first threshold Vth1. The ATC circuit 212 may be configured to enable the ATC of the transistor 202 if the qualified load current change $\Delta$Io has the decreasing direction and the magnitude of the qualified load current change $\Delta$Io satisfies the first threshold Vth1. In some implementations, the first threshold Vth1 may be a negative threshold, and the magnitude of the qualified load current change $\Delta$Io satisfies the first threshold Vth1 when the magnitude of the qualified load current change $\Delta$Io is more negative than (e.g., less than) the first threshold Vth1. The ATC circuit 212 may be configured to regulate, while the ATC is enabled, a power dissipation parameter to regulate a power dissipation of the transistor. The ATC circuit 212 may be configured to regulate the power dissipation parameter by setting the power dissipation parameter in a high-loss mode or in a low-loss mode.

In contrast, while the ATC is disabled, the ATC circuit 212 may be configured to not regulate the power dissipation parameter. In some implementations, the ATC circuit 212 may be configured to compare the magnitude of the qualified load current change $\Delta$Io to a second threshold Vth2. For example, the ATC circuit 212 may be configured to disable the ATC of the transistor 202 if the qualified load current change $\Delta$Io has the increasing direction and the magnitude of the qualified load current change $\Delta$Io satisfies the second threshold. In some implementations, the second threshold Vth2 may be a positive threshold, and the magnitude of the qualified load current change $\Delta$Io satisfies the second threshold Vth2 when the magnitude of the qualified load current change $\Delta$Io is more positive than (e.g., greater than) the second threshold Vth2. In some implementations, both the first threshold and the second threshold are fixed thresholds.

In some implementations, the magnitude of the qualified load current change $\Delta$Io is based on a difference between averaged values of the load current Io, including a first averaged value of the load current Io determined at a most-recent sampling time and a second averaged value of the load current determined at a previous sampling time. In other words, the average of the load current Io (or the average of the current sensor signal Isense) may be sampled at sampling intervals, and the difference between samples may be calculated for determining the magnitude of the qualified load current change $\Delta$Io.

In some implementations, the ATC circuit 212 may be configured to compare the magnitude of the load current Io to the second threshold Vth2, rather than the magnitude of the qualified load current change $\Delta$Io. In this case, the ATC circuit 212 may be configured to disable the ATC of the transistor 202 if the qualified load current change $\Delta$Io has the increasing direction and the magnitude of the load current Io satisfies the second threshold Vth2 (e.g., the load current Io is greater than the second threshold Vth2). In this case, the magnitude of the qualified load current change $\Delta$Io may be based on a difference between averaged values of the load current Io, including the first averaged value of the load current determined at the most-recent sampling time and the second averaged value of the load current determined at the previous sampling time. Additionally, the first averaged value of the load current Io may be used as the magnitude of the load current Io for comparing with the second threshold Vth2. In addition, the first threshold may be a fixed threshold and the second threshold may be a dynamic threshold. For example, the ATC circuit 212 may be configured to dynamically set the second threshold Vth2 equal to an averaged value of the load current Io sampled at a trigger time at which an enabling of the ATC is triggered by the ATC circuit 212. For example, the second threshold Vth2 may be set to a value of the load current Io that is detected at a time at which the ATC is enabled by the ATC circuit 212. Thus, the second threshold Vth2 may be set each time the ATC is enabled for use as a threshold value that is used by the ATC circuit 212 for determining when to disable the ATC.

In some implementations, the ATC circuit 212 may be configured to determine an average load current Io,avg of the load current Io and evaluate load current changes $\Delta$Io,avg of the average load current Io,avg for determining when to enable or disable the ATC of the transistor 202. For example, the ATC circuit 212 may be configured to detect a direction of a load current change $\Delta$Io,avg of the average load current Io,avg, detect a magnitude of the load current change $\Delta$Io,avg of the average load current Io,avg, and compare the magnitude of the load current change $\Delta$Io,avg to the first threshold Vth1. The ATC circuit 212 may be configured to enable the ATC of the transistor 202 if the load current change $\Delta$Io,avg has the decreasing direction and the magnitude of the load current change $\Delta$Io,avg satisfies the first threshold. The ATC circuit 212 may be configured to, while the ATC is enabled, regulate the power dissipation parameter to regulate the power dissipation of the transistor 202. In addition, while the ATC is disabled, the ATC circuit 212 may be configured to not regulate the power dissipation parameter. The ATC circuit 212 may be configured to compare the magnitude of the load current change $\Delta$Io,avg to a second threshold Vth2 (e.g., a fixed threshold), and disable the ATC of the transistor 202 if the load current change $\Delta$Io,avg has the increasing direction and the magnitude of the load current change $\Delta$Io,avg satisfies the second threshold Vth2. Alternatively, the ATC circuit 212 may be configured to compare a magnitude of the average load current Io,avg to the second threshold Vth2 (e.g., a dynamic threshold), and disable the ATC of the transistor 202 if the qualified load current change $\Delta$Io,avg has the increasing direction and the magnitude of the average load current Io,avg satisfies the second threshold Vth2. When used as a dynamic threshold, the second threshold Vth2 may be set to the value of the load current Io that is detected at the time the ATC is enabled by the ATC circuit 212.

As indicated above, FIG. 2 is provided as an example. Other examples may differ from what is described with regard to FIG. 2. The number and arrangement of devices and components shown in FIG. 2 are provided as an example. In practice, there may be additional devices or components, fewer devices or components, different devices or components, or differently arranged devices or components than those shown in FIG. 2.

Figure 3A:
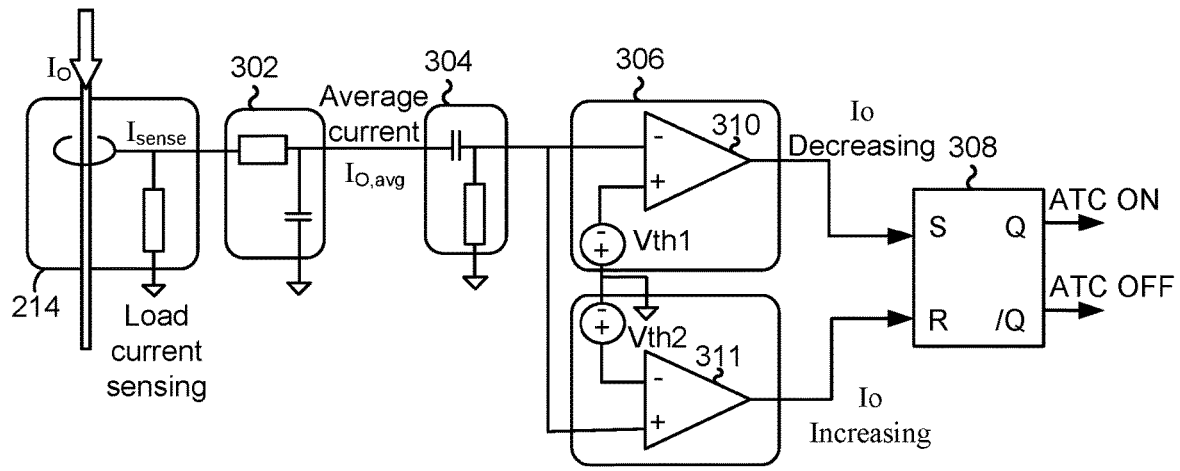
FIG. 3A illustrates a schematic block diagram of an active thermal control (ATC) circuit according to one or more implementations.

FIG. 3A illustrates a schematic block diagram of an ATC circuit 300A according to one or more implementations. The ATC circuit 300A may correspond to the ATC circuit 212 described in connection with FIG. 2. The ATC circuit 300A may be an analog circuit that may include the current sensor 214, a low-pass filter 302 having the time constant t, a high-pass filter 304, a comparator network 306, and an enable/disable circuit 308, such as a set-reset flip flop.

The low-pass filter 302 is configured to filter out fast transients of the load current and only allow qualified load current changes $\Delta$Io to pass for further evaluation. That is, the load current changes $\Delta$Io that are longer than a duration threshold corresponding to the time constant t of the low-pass filter 302 may be evaluated further as qualified load current changes, while those load current changes $\Delta$Io that are not longer than the duration threshold may be filtered out from being evaluated further. Thus, the low-pass filter 302 may be configured to receive the current sensor signal Isense, filter out load current change components of the current sensor signal Isense that do not satisfy the duration threshold, and output load current change components of the current sensor signal Isense that satisfy the duration threshold as the qualified load current changes. A low-pass filtering of an instantaneous load current Io or an instantaneous current sensor signal Isense performed by the low-pass filter 302 may result in the low-pass filter 302 generating an average of the load current (e.g., an average load current Io,avg).

The high-pass filter 304 may be coupled to an output of the low-pass filter 302 and may be configured to output a polarity and the magnitude of the qualified load current change. The polarity may be indicative of the direction of the qualified load current change. Thus, the high-pass filter 304 may be used to detect a direction of a change in the load current Io or a direction of a change in the average load current Io,avg. The current change edge may determine a polarity of an output of the high-pass filter 304, and may indicate whether the current change is increasing or decreasing.

The comparator network 306 may be coupled to an output of the high-pass filter 304 and may be configured to enable the ATC of the transistor 202 if the qualified load current change has the decreasing direction and the magnitude of the qualified load current change satisfies the first threshold Vth1, and to disable the ATC of the transistor 202 if the qualified load current change has the increasing direction and the magnitude of the qualified load current change satisfies the second threshold Vth2. For example, the comparator network 306 may include a first comparator 310 that monitors for qualified load current changes that have the decreasing direction and a second comparator 311 that monitors for qualified load current changes that have the increasing direction. If the first comparator 310 detects that a qualified load current change is sufficiently large (e.g., less than or more negative than the first threshold Vth1), the first comparator 310 may place the enable/disable circuit 308 in a set state (e.g., an enabled state), which enables the ATC of the transistor 202. Alternatively, if the second comparator 311 detects that a qualified load current change is sufficiently large (e.g., greater than the second threshold Vth2), the second comparator 311 may place the enable/disable circuit 308 in a reset state (e.g., a disabled state), which disables the ATC of the transistor 202.

Thus, the output of the high-pass filter 304 is compared with the first threshold Vth1 and the second threshold Vth2 for both positive and negative polarities, respectively. If the current change edge is positive and the current change magnitude of the average load current Io,avg is greater than the second threshold Vth2, the average current change ΔIo,avg is detected as increasing, and ATC will be turned off. If the current change edge is negative and the current change magnitude of the average load current Io,avg is less than the first threshold Vth1, the average current change ΔIo,avg is detected as decreasing, and ATC will be turned on.

As indicated above, FIG. 3A is provided merely as an example. Other examples may differ from what is described with regard to FIG. 3A.

Figure 3B:
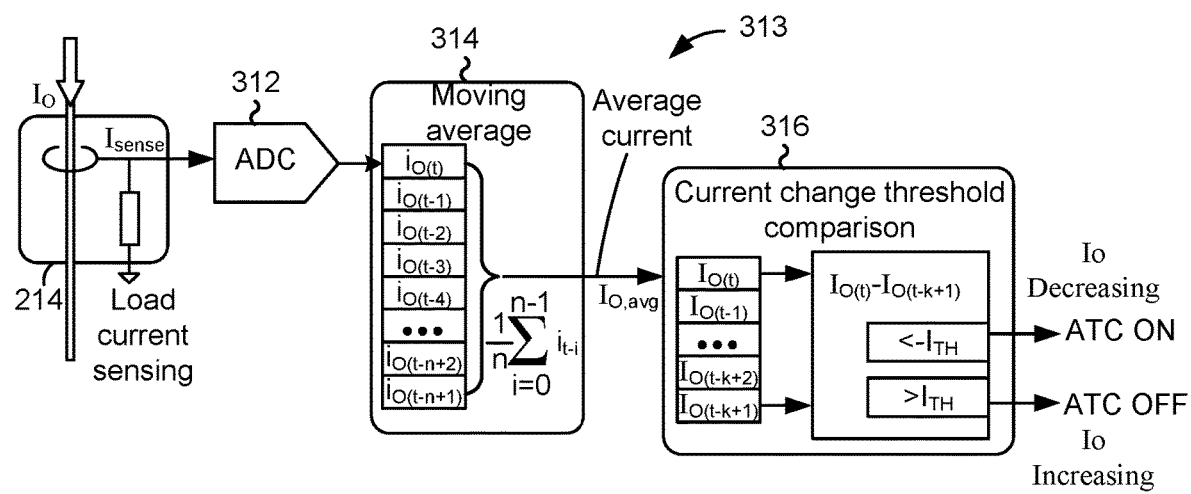
FIG. 3B illustrates a schematic block diagram of an ATC circuit according to one or more implementations.

FIG. 3B illustrates a schematic block diagram of an ATC circuit 300B according to one or more implementations. The ATC circuit 300B may correspond to the ATC circuit 212 described in connection with FIG. 2. The ATC circuit 300B may include the current sensor 214, and a digital circuit that may include an analog-to-digital converter (ADC) 312 and an evaluation circuit 313. The ADC 312 may be configured to convert the current sensor signal Isense into a digital signal. The evaluation circuit 313 may be configured to receive the digital signal, determine an average current value of the digital signal, and determine a difference value between a most-recent average current value and a previous average current value acquired prior to the most-recent average current value. The difference value may be the magnitude of the qualified load current change, and a polarity of the difference value may be indicative of the direction of a qualified load current change.

In some implementations, the evaluation circuit 313 may include a moving average filter 314 and a threshold comparison circuit 316. The moving average filter 314 may be configured to determine the average load current Io,avg by receiving the digital signal, sampling the digital signal at respective sampling times, and generating an average current value from N consecutive samples (e.g., n−1 consecutive samples) of the digital signal. The N consecutive samples may include a most-recent sample Io(t) of the digital signal, where N is an integer greater than one. The threshold comparison circuit 316 may be configured to sample the average load current Io,avg at respective sampling times and determine the difference value between the most-recent average current value Io(t) and the previous average current value Io(t−k+1) acquired prior to the most-recent average current value, where k represents a k-th sample prior to the most-recent average current value Io(t). The threshold comparison circuit 316 may be configured to compare the difference value to a first threshold −Ith and to a second threshold Ith. Both the first threshold −Ith and the second threshold Ith may be fixed thresholds. If the difference value is less than the first threshold −Ith, the average current change ΔIo,avg is detected as decreasing with sufficient magnitude to enable the ATC, and the threshold comparison circuit 316 may enable the ATC. On the other hand, if the difference value is greater than the second threshold Ith, the average current change ΔIo,avg is detected as increasing with sufficient magnitude to disable the ATC, and the threshold comparison circuit 316 may disable the ATC.

As indicated above, FIG. 3B is provided merely as an example. Other examples may differ from what is described with regard to FIG. 3B.

Figure 3C:
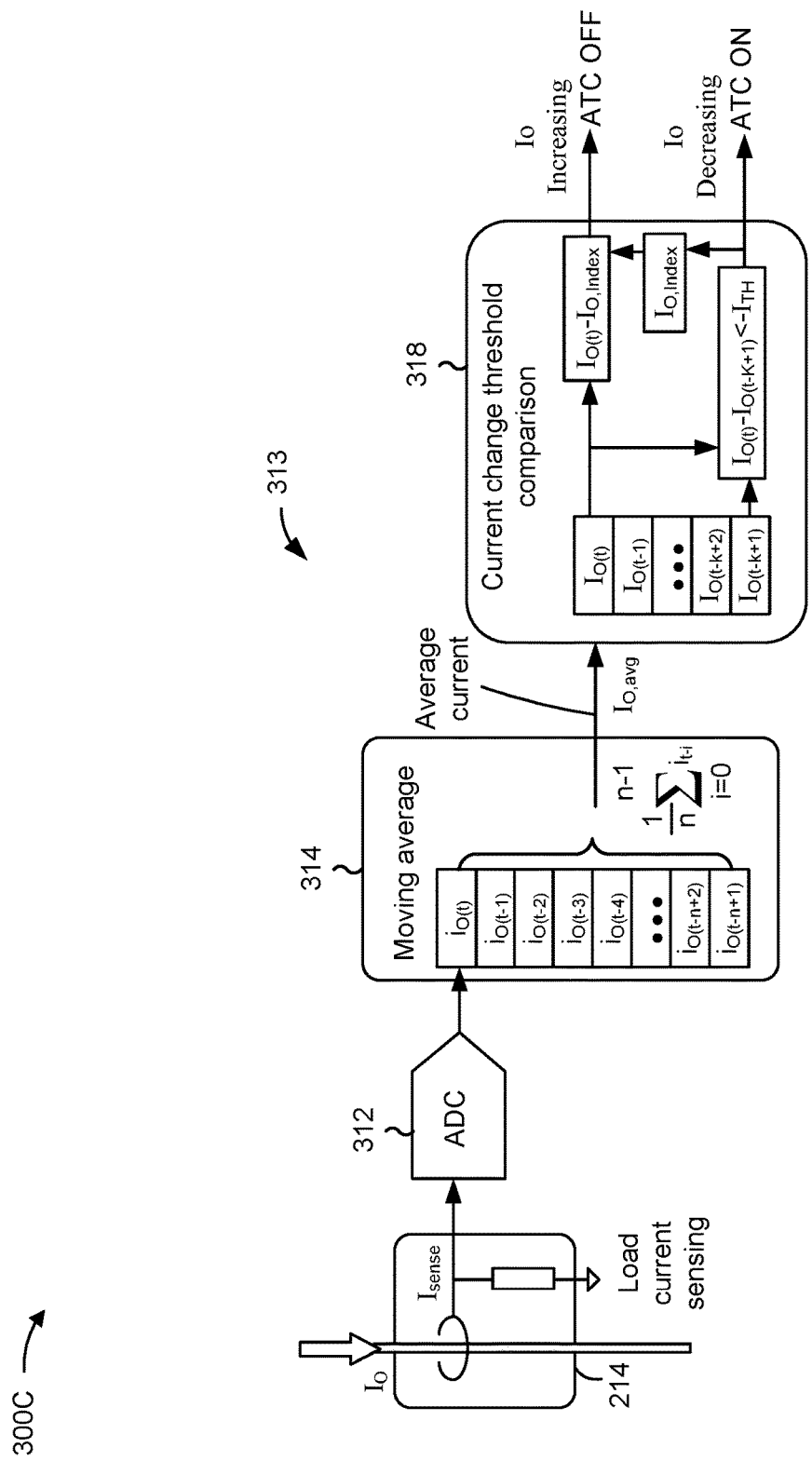
FIG. 3C illustrates a schematic block diagram of an ATC circuit according to one or more implementations.

FIG. 3C illustrates a schematic block diagram of an ATC circuit 300C according to one or more implementations. The ATC circuit 300C may correspond to the ATC circuit 212 described in connection with FIG. 2. The ATC circuit 300C may include the current sensor 214, and a digital circuit that may include an ADC 312 and an evaluation circuit 313. The ADC 312 may be configured to convert the current sensor signal Isense into a digital signal. The evaluation circuit 313 may be configured to receive the digital signal, determine an average current value of the digital signal, and determine a difference value between a most-recent average current value and a previous average current value acquired prior to the most-recent average current value. The difference value may be the magnitude of the qualified load current change, and a polarity of the difference value may be indicative of the direction of a qualified load current change. In some implementations, the evaluation circuit 313 may include the moving average filter 314 and a threshold comparison circuit 318.

The threshold comparison circuit 318 may be configured to sample the average load current Io,avg at respective sampling times and determine the difference value between the most-recent average current value Io(t) and the previous average current value Io(t−k+1) acquired prior to the most-recent average current value, where k represents a k-th sample prior to the most-recent average current value Io(t). The threshold comparison circuit 318 may be configured to compare the difference value to a first threshold −Ith in a similar manner as described above in connection with FIG. 3B. Thus, if the difference value is less than the first threshold −Ith, the average current change ΔIo,avg is detected as decreasing with sufficient magnitude to enable the ATC, and the threshold comparison circuit 318 may enable the ATC. The first threshold −Ith may be a fixed threshold.

In addition, the second threshold may be a dynamic threshold Io,index that is adjusted by the threshold comparison circuit 318. For example, the threshold comparison circuit 318 may be configured to dynamically set the second threshold Io,index to be equal to an averaged value of the load current Io sampled at a trigger time at which an enabling of the ATC is triggered by the threshold comparison circuit 318. For example, the second threshold Io,index may be set to a value of the load current Io (or the average load current Io,avg that is detected at a time the ATC is enabled by the threshold comparison circuit 318. Thus, the second threshold Io,index may be set each time the ATC is enabled for use as a threshold value that is used by the threshold comparison circuit 318 for determining when to disable the ATC.

The threshold comparison circuit 318 may be configured to monitor the load current Io (or the average load current Io,avg) and to detect a magnitude of the load current Io (or the average load current Io,avg) to be compared to the second threshold Io,index. For example, the threshold comparison circuit 318 may be configured to compare the magnitude of the load current Io (or the average load current Io,avg to the second threshold Io,index and disable the ATC of the transistor 202 if the qualified load current change has the increasing direction and the magnitude of the load current Io (or the magnitude of the average load current Io,avg) satisfies the second threshold Io,index (e.g., if the magnitude of the average load current Io,avg is greater than the second threshold Io,index).

As indicated above, FIG. 3C is provided merely as an example. Other examples may differ from what is described with regard to FIG. 3C.

Figure 4A:
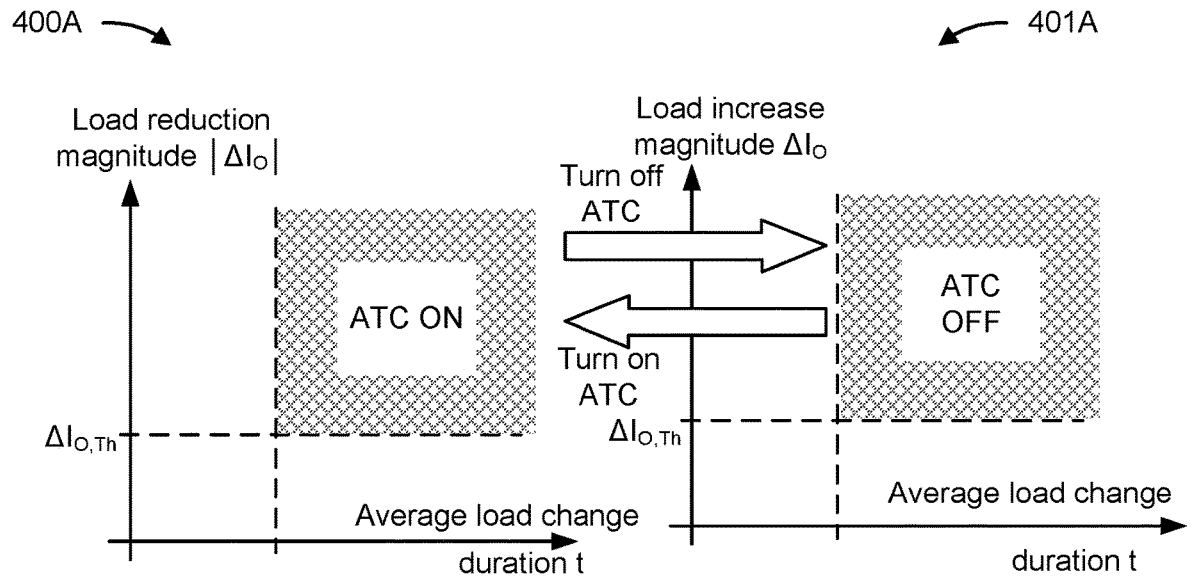
FIG. 4A illustrates a conditional ATC function according to one or more implementations.

FIG. 4A illustrates a conditional ATC function according to one or more implementations. FIG. 4A shows a first diagram 400A that illustrates a set of enablement conditions used for enabling the ATC and a second diagram 401A that illustrates a set of disablement conditions used for disabling the ATC. The conditional ATC function illustrated in FIG. 4A may be implemented by the ATC circuit 300A and the ATC circuit 300B as described in connection with FIGS. 3A and 3B, respectively. For example, thresholds in the first diagram 400A and the second diagram 401A may both be fixed, and the magnitude of the qualified load current change (e.g., the magnitude of the change to the average current ΔIo,avg) may be compared to both thresholds for turning the ATC on or off.

As indicated above, FIG. 4A is provided merely as an example. Other examples may differ from what is described with regard to FIG. 4A.

Figure 4B:
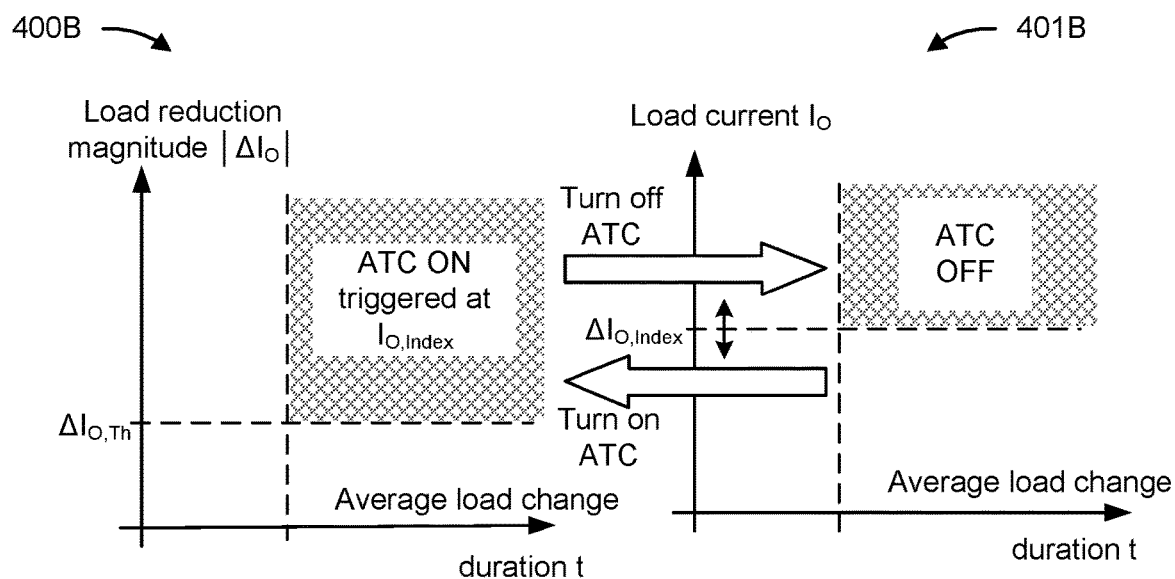
FIG. 4B illustrates a conditional ATC function according to one or more implementations.

FIG. 4B illustrates a conditional ATC function according to one or more implementations. FIG. 4B shows a first diagram 400B that illustrates a set of enablement conditions used for enabling the ATC and a second diagram 401B that illustrates a set of disablement conditions used for disabling the ATC. The conditional ATC function illustrated in FIG. 4B may be implemented by the ATC circuit 300C as described in connection with FIG. 3C.

For example, a threshold in the first diagram 400B may be fixed and a threshold the second diagram 401B (e.g., Io,index) may be adjustable. The magnitude of the qualified load current change (e.g., the magnitude of the change to the average current ΔIo,avg) may be compared to the threshold in the first diagram 400B for determining whether the ATC should be turned on. The magnitude of the average current Io,avg may be compared to the threshold in the second diagram 401B for determining whether the ATC should be turned off.

As indicated above, FIG. 4B is provided merely as an example. Other examples may differ from what is described with regard to FIG. 4B.

FIG. 5A illustrates a table 500A showing different control modes for ATC and corresponding power dissipation parameters, including gate resistance Rg, switching frequency $f_{sw}$, gate voltage Vg, and modulation scheme $M_{PWM}$. The different control modes include a two-step control mode, a multi-step control mode, and a continuous control mode. A "Y" indicates that a control mode may be used for a regulating a corresponding power dissipation parameter, and an "N" indicates that a control mode may not be used for regulating a corresponding power dissipation parameter. During the two-step control mode, a power dissipation parameter may be switched between a low-loss mode (e.g., a low-loss setting) and a high-loss mode (e.g., a high-loss setting) in order to regulate the power dissipation of the transistor 202. The ATC circuit 212 may be configured to regulate a power dissipation parameter by setting the power dissipation parameter in the high-loss mode or the low-loss mode. During the multi-step control mode, a power dissipation parameter may be switched between two or more discrete modes or settings, including a low-loss mode and a high-loss mode, in order to regulate the power dissipation of the transistor 202. In some implementations, during the multi-step control mode, the power dissipation parameter may be switched between three or more discrete modes or settings, including the low-loss mode, at least one intermediate-loss mode, and the high-loss mode, in order to regulate the power dissipation of the transistor 202. During the continuous control mode, a power dissipation parameter may be adjusted along a characteristic curve in order to regulate the power dissipation of the transistor 202.

As indicated above, FIG. 5A is provided merely as an example. Other examples may differ from what is described with regard to FIG. 5A.

FIG. 5B illustrates a table 500B showing power dissipation parameters, including gate resistance Rg, switching frequency $f_{sw}$, gate voltage Vg, and modulation scheme $M_{PWM}$, that may be used during a two-step control mode for ATC. During the two-step control mode, a power dissipation parameter may be switched between a low-loss mode (e.g., a low-loss setting) and a high-loss mode (e.g., a high-loss setting) in order to regulate the power dissipation of the transistor 202. For example, the ATC circuit 212 may be configured to switch between the low-loss mode and the high-loss mode of a power dissipation parameter according to a duty cycle $D_{ATC}$ of the power dissipation parameter to regulate the power dissipation of the transistor 202. The duty cycle $D_{ATC}$ of the power dissipation parameter may be defined as a ratio of an amount of time $T_{Hi}$ that the power dissipation parameter is set in the high-loss mode and a total amount of time (e.g., $T_{Hi}+T_{Lo}$) comprising a sum of the amount of time $T_{Hi}$ that the power dissipation parameter is set in the high-loss mode and an amount of time $T_{Lo}$ that the power dissipation parameter is set in the low-loss mode. In other words, the duty cycle $D_{ATC}$ of the power dissipation parameter may be equal to $T_{Hi}/(T_{Hi}+T_{Lo})$. To regulate the power dissipation of the transistor 202, the ATC circuit 212 may switch between different duty cycles $D_{ATC}$. For example, to increase the power dissipation of the transistor 202, the ATC circuit 212 may increase the duty cycle $D_{ATC}$ of the power dissipation parameter, and to decrease the power dissipation of the transistor 202, the ATC circuit 212 may decrease the duty cycle $D_{ATC}$ of the power dissipation parameter. For example, by increasing the duty cycle $D_{ATC}$ as the load current Io decreases, a constant power dissipation can be achieved. In some implementations, the duty cycle $D_{ATC}$ of the power dissipation parameter is set to zero when the ATC is disabled, to always operate in the low-loss mode.

As indicated above, FIG. 5B is provided merely as an example. Other examples may differ from what is described with regard to FIG. 5B.

Figure 6A:
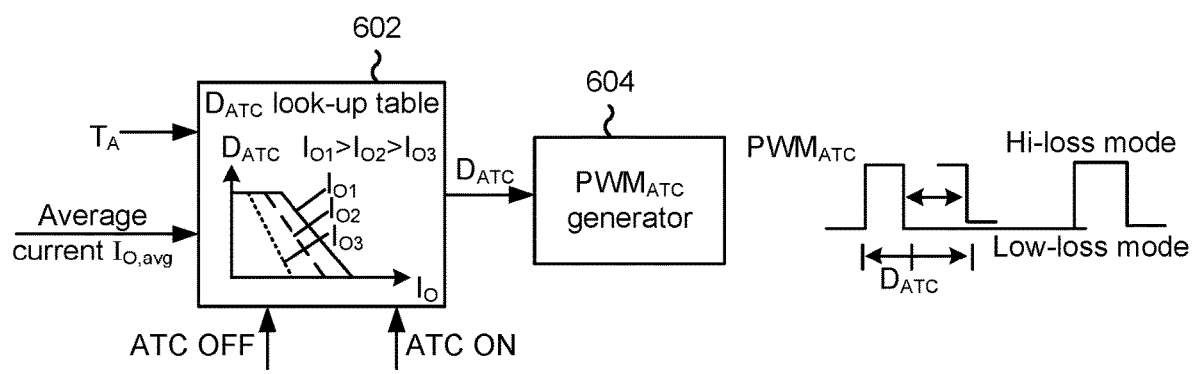
FIG. 6A illustrates a parameter selection circuit for a two-step control mode of an ATC circuit according to one or more implementations.

FIG. 6A illustrates a parameter selection circuit 600A for a two-step control mode of an ATC circuit according to one or more implementations. For the two-step control mode, the ATC circuit 212 may be configured to toggle a power dissipation parameter (e.g., gate resistance Rg, switching frequency $f_{sw}$, gate voltage Vg, or modulation scheme $M_{PWM}$) between a low-loss mode and a high-loss mode on top of the PWM switching controlled by the controller 104. An averaged power loss can be controlled by modulating the duty cycle $D_{ATC}$ of the power dissipation parameter.

The power dissipation $P_D$ of the transistor 202 may be measured across a full range of the load current Io, with the duty cycle $D_{ATC}$ as a parameter that ranges between 0 (e.g., corresponding to always operating in low-loss mode) to 1 (e.g., corresponding to always operating in high-loss mode). A set of $P_D$-Io curves may be obtained for different values of the duty cycle $D_{ATC}$. From the $P_D$-Io curves, a set of $D_{ATC}$ vs. Io characteristic curves can be derived, with power dissipation $P_D$ as a parameter, which ranges from $P_{D,Min}$ to $P_{D,Max}$. Alternatively, the set of $D_{ATC}$ VS. Io characteristic curves may be stored in a lookup table 602 that is stored in a memory associated with the ATC circuit 212, and the set of $D_{ATC}$ VS. Io characteristic curves may be indexed by a load current index value Io,index as a characteristic curve selection parameter. The ATC circuit 212 may be configured to select a $D_{ATC}$ VS. Io characteristic curve from a plurality of $D_{ATC}$ VS. Io characteristic curves based on a load current index value Io,index. The ATC circuit 212 may then use the selected $D_{ATC}$ vs. Io characteristic curve for ATC of the transistor 202. For example, the ATC circuit 212 may be configured to receive the average load current Io,avg as an input to the lookup table 602, and, while the ATC is enabled, regulate the duty cycle $D_{ATC}$ of the power dissipation parameter according to the selected $D_{ATC}$ VS. Io characteristic curve based on the average load current Io,avg. Thus, the duty cycle $D_{ATC}$ may be adjusted as the average load current Io,avg changes in accordance with the selected $D_{ATC}$ VS. Io characteristic curve.

The load current index value Io,index may be determined in a similar manner as described above for setting the dynamic threshold of the second threshold Vth2. For example, the load current index value Io,index may be a value of a most-recent sample of the average load current that results in an enabling of the ATC being triggered by the ATC circuit 212.

In some implementations, the ATC circuit 212 may be configured to receive the ambient temperature $T_A$ as an additional input for regulating the duty cycle $D_{ATC}$ in accordance with the selected $D_{ATC}$ VS. Io characteristic curve. Thus, the ATC circuit 212 may be configured to receive the ambient temperature $T_A$ and the average load current Io,avg as inputs to the lookup table 602 and, while the ATC is enabled, regulate the duty cycle $D_{ATC}$ of the power dissipation parameter according to the selected characteristic curve based on the ambient temperature $T_A$ and the average load current Io,avg in accordance with the selected $D_{ATC}$ VS. Io characteristic curve. Therefore, the $D_{ATC}$ VS. Io characteristic curves may be implemented in a lookup table 602, with the load current Io (or average load current Io,avg) and the ambient temperature $T_A$ as parameter selection inputs, the duty cycle $D_{ATC}$ as an output, and Io,index as the characteristic curve selection parameter.

When the ATC is on (enabled), the duty cycle $D_{ATC}$ may be determined by Io and $T_A$. The duty cycle $D_{ATC}$ may increase as Io decreases such that the power dissipation $P_D$ and the junction temperature Tj will be constant throughout an Io range of the selected $D_{ATC}$ VS. Io characteristic curve. The present value of Io at the time the ATC is enabled may be used as the Io,index in the selection of the applicable $D_{ATC}$ vs. Io characteristic curve. When the ATC is off (disabled), the ATC circuit 212 may set the duty cycle $D_{ATC}$ to zero such that the power dissipation parameter is operated in low-loss mode. The lookup table 602 may be configured to offset a change in the ambient temperature $T_A$ by regulating the power dissipation of the transistor 202 to produce a temperature change of the junction temperature Tj to be opposite to the change in the ambient temperature $T_A$. The lookup table 602 may be enabled or disabled by ATC on and ATC off control signals provided by the ATC circuits 300A, 300B, or 300C.

The lookup table 602 may be configured to provide the duty cycle $D_{ATC}$ to an $PWM_{ATC}$ generator 604 that may be configured to regulate the power dissipation parameter according to the duty cycle $D_{ATC}$ received from the lookup table 602. For example, the $PWM_{ATC}$ generator 604 may be configured to output a control signal that controls the mode of the power dissipation parameter. In other words, the control signal from the $PWM_{ATC}$ generator 604 may be a PWM signal that switches the power dissipation parameter between its low-loss mode and its high-loss mode according to the duty cycle $D_{ATC}$.

As indicated above, FIG. 6A is provided merely as an example. Other examples may differ from what is described with regard to FIG. 6A.

Figure 6B:
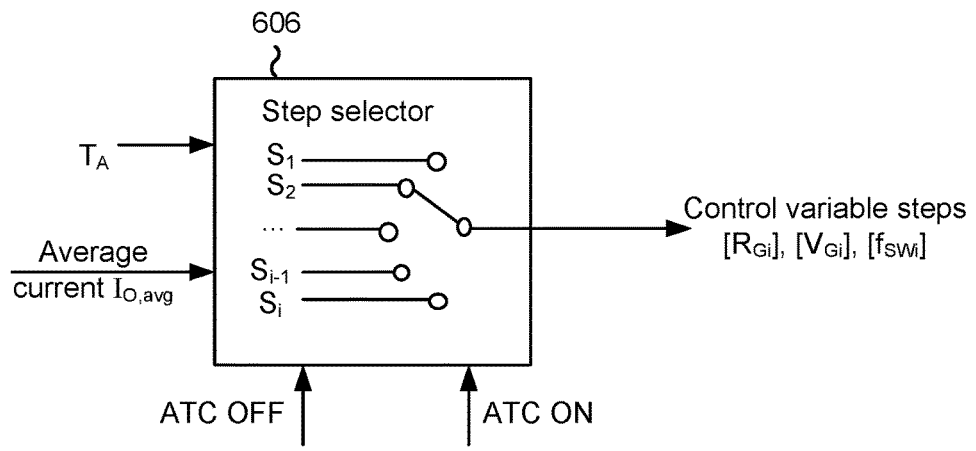
FIG. 6B illustrates a parameter selection circuit for a multi-step control mode of an ATC circuit according to one or more implementations.

FIG. 6B illustrates a parameter selection circuit 600B for a multi-step control mode of an ATC circuit according to one or more implementations. For the multi-step control mode, the ATC circuit 212 may be configured to adjust a power dissipation parameter (e.g., gate resistance Rg, switching frequency $f_{sw}$, or gate voltage Vg) between two or more power dissipation parameter values. The parameter selection circuit 600B may include a step selector circuit 606 that may be configured with a range of a plurality of power dissipation parameter values. The step selector circuit 606 may be configured to regulate the power dissipation parameter by setting the power dissipation parameter to a power dissipation parameter value from the range of the plurality of power dissipation parameter values. For example, the step selector circuit 606 may receive the ambient temperature $T_A$ and the average load current Io,avg as inputs for selecting the power dissipation parameter value from the plurality of power dissipation parameter values. The step selector circuit 606 may be configured to, while the ATC is enabled, select the power dissipation parameter value from the plurality of power dissipation parameter values based on the ambient temperature $T_A$ and the average load current Io,avg. The step selector circuit 606 may be configured to offset a change in the ambient temperature $T_A$ by regulating the power dissipation of the transistor 202 to produce a temperature change of the junction temperature Tj to be opposite to the change in the ambient temperature $T_A$. The step selector circuit 606 may be enabled or disabled by ATC on and ATC off control signals provided by the ATC circuits 300A, 300B, or 300C.

As indicated above, FIG. 6B is provided merely as an example. Other examples may differ from what is described with regard to FIG. 6B.

Figure 6C:
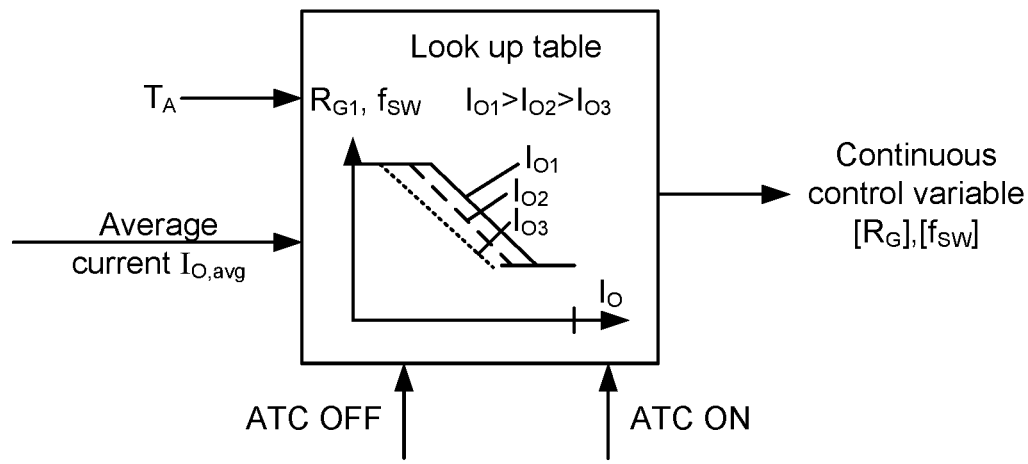
FIGS. 6C and 6D illustrate parameter selection circuits for a continuous control mode of an ATC circuit according to one or more implementations.
Figure 6D:
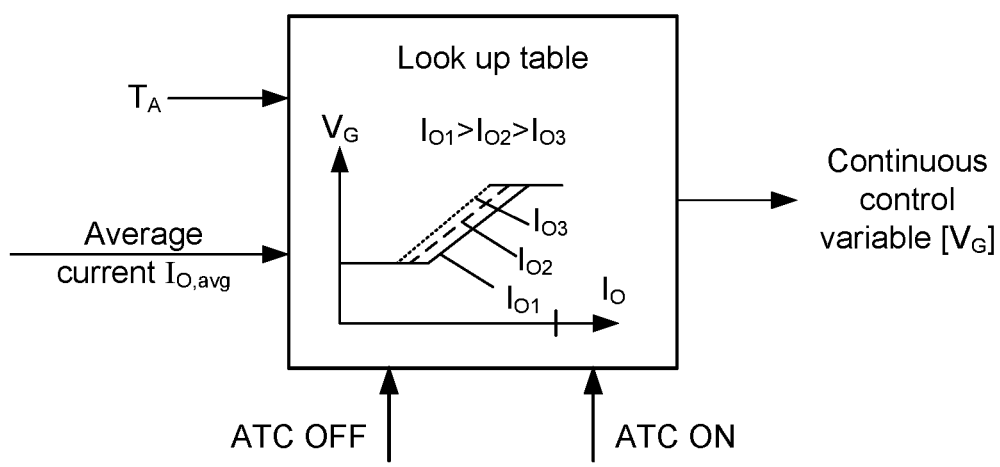

FIGS. 6C and 6D illustrate parameter selection circuits 600C and 600D for a continuous control mode of an ATC circuit according to one or more implementations. A set of power dissipation parameter vs. Io characteristic curves can be derived with power dissipation $P_D$ or Io,index as a parameter. Since $P_D$ increases with an increase of Rg and $f_{sw}$, and $P_D$ increases with a decrease of Vg, the characteristic curves for Rg vs. Io and $f_{sw}$ vs. Io will have a negative slope, as shown in FIG. 6C, while the characteristic curves of Vg vs Io will have a positive slope, as shown in FIG. 6D. The parameter selection circuits 600C and 600D may be implemented as lookup tables with the load current Io (or average load current Io,avg) and the ambient temperature $T_A$ as parameter selection inputs, the power dissipation parameter Rg, $f_{sw}$, or Vg as an output, and Io,index as the characteristic curve selection parameter. Thus, the load current index value Io,index may be used to select a characteristic curve from the set of power dissipation parameter vs. Io characteristic curves, as similarly described in connection with FIG. 6A.

The parameter selection circuits 600C and 600D may each be configured to regulate a power dissipation parameter by setting the power dissipation parameter to a power dissipation parameter value from a range of a plurality of power dissipation parameter values. The selected power dissipation parameter vs. Io characteristic curve may define the range of the plurality of power dissipation parameter values and a slope of the plurality of power dissipation parameter values. The parameter selection circuits 600C and 600D may each be configured to receive the ambient temperature $T_A$ and the average load current Io,avg as inputs for the selected power dissipation parameter vs. Io characteristic curve and, while the ATC is enabled, select the power dissipation parameter value according to the selected power dissipation parameter vs. Io characteristic curve based on the ambient temperature $T_A$ and the average load current Io,avg to regulate the junction temperature Tj of the transistor 202. The parameter selection circuits 600C and 600D may be configured to offset a change in the ambient temperature $T_A$ by regulating the power dissipation of the transistor 202 to produce a temperature change of the junction temperature Tj to be opposite to the change in the ambient temperature $T_A$. The parameter selection circuits 600C and 600D may be enabled or disabled by ATC on and ATC off control signals provided by the ATC circuits 300A, 300B, or 300C.

As indicated above, FIGS. 6C and 6D are provided merely as examples. Other examples may differ from what is described with regard to FIGS. 6C and 6D.

The following provides an overview of some Aspects of the present disclosure:

Aspect 1: A gate driver system, comprising: a gate driver configured to be coupled to a control terminal of a transistor and configured to control a control voltage applied to the control terminal in order to drive the transistor between switching states; and an active thermal control circuit configured to monitor load current changes of a load current conducted by the transistor in a conduction state, and enable or disable an active thermal control of the transistor based on the load current changes, wherein the active thermal control circuit is configured to evaluate load current changes that satisfy a duration threshold as qualified load current changes, wherein the active thermal control circuit is configured to detect a direction of a qualified load current change of the qualified load current changes, wherein the direction of the qualified load current change is an increasing direction or a decreasing direction, wherein the active thermal control circuit is configured to detect a magnitude of the qualified load current change of the qualified load current changes, and compare the magnitude to a first threshold, wherein the active thermal control circuit is configured to enable the active thermal control of the transistor if the qualified load current change has the decreasing direction and the magnitude of the qualified load current change satisfies the first threshold, wherein the active thermal control circuit is configured to regulate, while the active thermal control is enabled, a power dissipation parameter to regulate a power dissipation of the transistor, and wherein, while the active thermal control is disabled, the active thermal control circuit is configured to not regulate the power dissipation parameter.

Aspect 2: The gate driver system of Aspect 1, wherein the active thermal control circuit is configured to compare the magnitude of the qualified load current change to a second threshold, and wherein the active thermal control circuit is configured to disable the active thermal control of the transistor if the qualified load current change has the increasing direction and the magnitude of the qualified load current change satisfies the second threshold.

Aspect 3: The gate driver system of Aspect 2, wherein the first threshold and the second threshold are fixed thresholds.

Aspect 4: The gate driver system of Aspect 2, wherein the magnitude of the qualified load current change is based on a difference between averaged values of the load current, including a first averaged value of the load current determined at a most-recent sampling time and a second averaged value of the load current determined at a previous sampling time.

Aspect 5: The gate driver system of Aspect 2, wherein the first threshold is a negative threshold and the magnitude of the qualified load current change satisfies the first threshold when the magnitude of the qualified load current change is less than the first threshold, and wherein the second threshold is a positive threshold and the magnitude of the qualified load current change satisfies the second threshold when the magnitude of the qualified load current change is greater than the second threshold.

Aspect 6: The gate driver system of any of Aspects 1-5, wherein the active thermal control circuit is configured to monitor the load current and to detect a magnitude of the load current, wherein the active thermal control circuit is configured to compare the magnitude of the load current to the second threshold, and wherein the active thermal control circuit is configured to disable the active thermal control of the transistor if the qualified load current change has the increasing direction and the magnitude of the load current satisfies the second threshold.

Aspect 7: The gate driver system of Aspect 6, wherein the first threshold is a negative threshold and the magnitude of the qualified load current change satisfies the first threshold when the magnitude of the qualified load current change is less than the first threshold, and wherein the second threshold is a positive threshold and the magnitude of the load current satisfies the second threshold when the magnitude of the load current is greater than the second threshold.

Aspect 8: The gate driver system of Aspect 6, wherein the magnitude of the qualified load current change is based on a difference between averaged values of the load current, including a first averaged value of the load current determined at a most-recent sampling time and a second averaged value of the load current determined at a previous sampling time, and wherein the magnitude of the load current is the first averaged value of the load current.

Aspect 9: The gate driver system of Aspect 7, wherein the first threshold is a fixed threshold and the second threshold is a dynamic threshold, and wherein the active thermal control circuit is configured to dynamically set the second threshold equal to an averaged value of the load current sampled at a trigger time at which an enabling of the active thermal control is triggered by the active thermal control circuit.

Aspect 10: The gate driver system of Aspect 2, wherein the active thermal control circuit comprises: a current sensor configured to sense the load current and generate a sensor signal representative of the load current; a low-pass filter configured to receive the sensor signal and filter out load current change components of the sensor signal that do not satisfy the duration threshold and output load current change components of the sensor signal that satisfy the duration threshold as the qualified load current changes; a high-pass filter coupled to an output of the low-pass filter and configured to output a polarity and the magnitude of the qualified load current change, wherein the polarity is indicative of the direction of the qualified load current change; and a comparator network coupled to an output of the high-pass filter and configured to enable the active thermal control of the transistor if the qualified load current change has the decreasing direction and the magnitude of the qualified load current change satisfies the first threshold, and to disable the active thermal control of the transistor if the qualified load current change has the increasing direction and the magnitude of the qualified load current change satisfies the second threshold.

Aspect 11: The gate driver system of Aspect 2, wherein the active thermal control circuit comprises: a current sensor configured to sense the load current and generate a sensor signal representative of the load current; an analog-to-digital converter (ADC) configured to convert the sensor signal into a digital signal; a moving average filter configured to receive the digital signal and generate an average current value from N consecutive samples of the digital signal, wherein the N consecutive samples include a most-recent sample of the digital signal, and wherein N is an integer greater than one; and an evaluation circuit configured to determine a difference value between a most-recent average current value and a previous average current value acquired prior to the most-recent average current value, wherein the difference value is the magnitude of the qualified load current change and a polarity of the difference value is indicative of the direction of a qualified load current change.

Aspect 12: The gate driver system of Aspect 11, wherein the evaluation circuit is configured to compare the difference value to the first threshold and the second threshold, and enable or disable the active thermal control of the transistor based on the difference value satisfying the first threshold or the second threshold.

Aspect 13: The gate driver system of any of Aspects 1-12, wherein the load current changes are load current transients of the load current caused by a change in load.

Aspect 14: The gate driver system of any of Aspects 1-13, wherein the power dissipation parameter is a gate drive resistance coupled to the control terminal, a gate drive voltage applied to the control terminal during the conduction state, a switching frequency of the transistor, or a pulse-width modulation (PWM) scheme of the gate drive voltage applied to the control terminal to drive the switching states.

Aspect 15: A gate driver system, comprising: a gate driver configured to be coupled to the control terminal of a transistor and configured to control a control voltage applied to the control terminal in order to drive the transistor between switching states; and an active thermal control circuit configured to monitor a load current conducted by the transistor in a conduction state, and enable or disable an active thermal control of the transistor based on the load current, wherein the active thermal control circuit is configured to determine an average load current of the load current and evaluate load current changes of the average load current, wherein evaluating the load current changes of the average load current includes: detecting a direction of a load current change of the average load current, wherein the direction of the load current change is an increasing direction or a decreasing direction, detecting a magnitude of the load current change of the average load current, and comparing the magnitude of the load current change to a first threshold, wherein, the active thermal control circuit is configured to enable the active thermal control of the transistor if the load current change has the decreasing direction and the magnitude of the load current change satisfies the first threshold, and wherein, the active thermal control circuit is configured to, while the active thermal control is enabled, regulate a power dissipation parameter to regulate a power dissipation of the transistor, and wherein, while the active thermal control is disabled, the active thermal control circuit is configured to not regulate the power dissipation parameter.

Aspect 16: The gate driver system of Aspect 15, wherein the active thermal control circuit is configured to compare the magnitude of the load current change to a second threshold, and wherein, the active thermal control circuit is configured to disable the active thermal control of the transistor if the load current change has the increasing direction and the magnitude of the load current change satisfies the second threshold.

Aspect 17: The gate driver system of any of Aspects 15-16, wherein the active thermal control circuit is configured to compare a magnitude of the average load current to the second threshold, and wherein the active thermal control circuit is configured to disable the active thermal control of the transistor if the qualified load current change has the increasing direction and the magnitude of the average load current satisfies the second threshold.

Aspect 18: The gate driver system of any of Aspects 15-17, wherein the active thermal control circuit is configured to regulate the power dissipation parameter by setting the power dissipation parameter in a high-loss mode or a low-loss mode.

Aspect 19: The gate driver system of Aspect 18, wherein, the active thermal control circuit is configured to, while the active thermal control is enabled, regulate the power dissipation parameter according to a duty cycle of the power dissipation parameter during which the active thermal control circuit switches the power dissipation parameter between the high-loss mode and the low-loss mode to regulate the power dissipation of the transistor.

Aspect 20: The gate driver system of Aspect 19, wherein the duty cycle of the power dissipation parameter is a ratio of an amount of time that the power dissipation parameter is set in the high-loss mode and a total amount of time comprising a sum of the amount of time that the power dissipation parameter is set in the high-loss mode and an amount of time that the power dissipation parameter is set in the low-loss mode.

Aspect 21: The gate driver system of Aspect 19, wherein the active thermal control circuit is configured to receive an ambient temperature and the average load current as inputs, and wherein the active thermal control circuit is configured to, while the active thermal control is enabled, regulate the duty cycle of the power dissipation parameter according to a characteristic curve based on the ambient temperature and the average load current.

Aspect 22: The gate driver system of Aspect 21, wherein the characteristic curve is implemented as a look-up table stored in memory.

Aspect 23: The gate driver system of Aspect 21, wherein the active thermal control circuit is configured to select the characteristic curve from a plurality of characteristic curves stored in a memory associated with the active thermal control circuit based on a load current index value, wherein the load current index value is a value of a most-recent sample of the average load current that results in an enabling of the active thermal control being triggered by the active thermal control circuit.

Aspect 24: The gate driver system of Aspect 19, wherein the power dissipation parameter is a gate drive resistance coupled to the control terminal, a gate drive voltage applied to the control terminal during the conduction state, a switching frequency of the transistor, or a pulse-width modulation (PWM) scheme of the gate drive voltage applied to the control terminal to drive the switching states.

Aspect 25: The gate driver system of any of Aspects 15-24, wherein the active thermal control circuit is configured to regulate the power dissipation parameter by setting the power dissipation parameter to a power dissipation parameter value from a range of a plurality of power dissipation parameter values, wherein a characteristic curve defines the range of the plurality of power dissipation parameter values and a slope of the plurality of power dissipation parameter values, wherein the active thermal control circuit is configured to receive an ambient temperature and the average load current as inputs for the characteristic curve, wherein, the active thermal control circuit is configured to, while the active thermal control is enabled, select the power dissipation parameter value according to the characteristic curve based on the ambient temperature and the average load current to regulate a junction temperature of the transistor, and wherein the active thermal control circuit is configured to offset a change in the ambient temperature by regulating the power dissipation of the transistor to produce a temperature change of the junction temperature to be opposite to the change in the ambient temperature.

Aspect 26: The gate driver system of any of Aspects 15-25, wherein the active thermal control circuit is configured to regulate the power dissipation parameter by setting the power dissipation parameter to a power dissipation parameter value from a range of a plurality of power dissipation parameter values, wherein the active thermal control circuit is configured to receive an ambient temperature and the average load current as inputs for selecting the power dissipation parameter value from the plurality of power dissipation parameter values, wherein, the active thermal control circuit is configured to, while the active thermal control is enabled, select the power dissipation parameter value from the plurality of power dissipation parameter values based on the ambient temperature and the average load current.

Aspect 27: The gate driver system of Aspect 26, wherein the power dissipation parameter is a gate drive resistance coupled to the control terminal, a gate drive voltage applied to the control terminal during the conduction state, or a switching frequency of the transistor.

Aspect 28: A method of driving a transistor between switching states, comprising: monitoring load current changes of a load current conducted by the transistor in a conduction state; enabling or disabling an active thermal control of the transistor based on the load current changes; evaluating load current changes that satisfy a duration threshold as qualified load current changes; detecting a direction of a qualified load current change of the qualified load current changes, wherein the direction of the qualified load current change is an increasing direction or a decreasing direction; detecting a magnitude of the qualified load current change of the qualified load current changes; comparing the magnitude to a first threshold; and enabling the active thermal control of the transistor if the qualified load current change has the decreasing direction and the magnitude of the qualified load current change satisfies the first threshold, wherein, while the active thermal control is enabled, an active thermal control circuit is enabled to regulate a power dissipation parameter to regulate a power dissipation of the transistor, and wherein, while the active thermal control is disabled, the active thermal control circuit is disabled such that the power dissipation parameter is not regulated by the active thermal control circuit.

Aspect 29: A system configured to perform one or more operations recited in one or more of Aspects 1-28.

Aspect 30: An apparatus comprising means for performing one or more operations recited in one or more of Aspects 1-28.

Aspect 31: A non-transitory computer-readable medium storing a set of instructions, the set of instructions comprising one or more instructions that, when executed by a device, cause the device to perform one or more operations recited in one or more of Aspects 1-28.

Aspect 32: A computer program product comprising instructions or code for executing one or more operations recited in one or more of Aspects 1-28.

The foregoing disclosure provides illustration and description, but is not intended to be exhaustive or to limit the implementations to the precise form disclosed. Modifications and variations may be made in light of the above disclosure or may be acquired from practice of the implementations.

Some implementations may be described herein in connection with thresholds. As used herein, "satisfying" a threshold may refer to a value being greater than the threshold, more than the threshold, higher than the threshold, greater than or equal to the threshold, less than the threshold, fewer than the threshold, lower than the threshold, less than or equal to the threshold, equal to the threshold, or the like.

As used herein, the term "component" is intended to be broadly construed as hardware, firmware, or a combination of hardware and software. Systems and/or methods described herein may be implemented in different forms of hardware, firmware, or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be designed to implement the systems and/or methods based on the description herein.

Any of the processing components may be implemented as a central processing unit (CPU) or other processor reading and executing a software program from a non-transitory computer-readable recording medium such as a hard disk or a semiconductor memory device. For example, instructions may be executed by one or more processors, such as one or more CPUs, digital signal processors (DSPs), general-purpose microprocessors, application-specific integrated circuits (ASICs), field programmable logic arrays (FPLAs), programmable logic controller (PLC), or other equivalent integrated or discrete logic circuitry. Accordingly, the term "processor," as used herein, refers to any of the foregoing structures or any other structure suitable for implementation of the techniques described herein. Software may be stored on a non-transitory computer-readable medium such that the non-transitory computer readable medium includes program code or a program algorithm stored thereon that, when executed, causes the processor, via a computer program, to perform the steps of a method.

A controller including hardware may also perform one or more of the techniques of this disclosure. A controller, including one or more processors, may use electrical signals and digital algorithms to perform its receptive, analytic, and control functions, which may further include corrective functions. Such hardware, software, and firmware may be implemented within the same device or within separate devices to support the various techniques described in this disclosure.

A signal processing circuit and/or a signal conditioning circuit may receive one or more signals (e.g., measurement signals) from one or more components in the form of raw measurement data and may derive, from the measurement signal, further information. "Signal conditioning," as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation, and any other processes required to make a signal suitable for processing after conditioning.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a and b, a and c, b and c, and a, b, and c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some implementations, a single act may include or may be broken into multiple sub acts. Such sub acts may be included and part of the disclosure of this single act unless explicitly excluded.

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A gate driver system, comprising:
a gate driver configured to be coupled to a control terminal of a transistor and configured to control a control voltage applied to the control terminal in order to drive the transistor between switching states; and
an active thermal control circuit configured to monitor load current changes of a load current conducted by the transistor in a conduction state, and enable or disable an active thermal control of the transistor based on the load current changes,
wherein the active thermal control circuit is configured to evaluate load current changes that satisfy a duration threshold as qualified load current changes,
wherein the active thermal control circuit is configured to detect a direction of a qualified load current change of the qualified load current changes, wherein the direction of the qualified load current change is an increasing direction or a decreasing direction,
wherein the active thermal control circuit is configured to detect a magnitude of the qualified load current change of the qualified load current changes, and compare the magnitude to a first threshold,
wherein the active thermal control circuit is configured to enable the active thermal control of the transistor if the qualified load current change has the decreasing direction and the magnitude of the qualified load current change satisfies the first threshold,
wherein the active thermal control circuit is configured to regulate, while the active thermal control is enabled, a power dissipation parameter to regulate a power dissipation of the transistor, and
wherein, while the active thermal control is disabled, the active thermal control circuit is configured to not regulate the power dissipation parameter.

2. The gate driver system of claim 1, wherein the active thermal control circuit is configured to compare the magnitude of the qualified load current change to a second threshold, and
wherein the active thermal control circuit is configured to disable the active thermal control of the transistor if the qualified load current change has the increasing direction and the magnitude of the qualified load current change satisfies the second threshold.

3. The gate driver system of claim 2, wherein the magnitude of the qualified load current change is based on a difference between averaged values of the load current, including a first averaged value of the load current determined at a most-recent sampling time and a second averaged value of the load current determined at a previous sampling time.

4. The gate driver system of claim 2, wherein the first threshold is a negative threshold and the magnitude of the qualified load current change satisfies the first threshold when the magnitude of the qualified load current change is less than the first threshold, and
wherein the second threshold is a positive threshold and the magnitude of the qualified load current change satisfies the second threshold when the magnitude of the qualified load current change is greater than the second threshold.

5. The gate driver system of claim 1, wherein the active thermal control circuit is configured to monitor the load current and to detect a magnitude of the load current,
wherein the active thermal control circuit is configured to compare the magnitude of the load current to a second threshold, and
wherein the active thermal control circuit is configured to disable the active thermal control of the transistor if the qualified load current change has the increasing direction and the magnitude of the load current satisfies the second threshold.

6. The gate driver system of claim 5, wherein the first threshold is a negative threshold and the magnitude of the qualified load current change satisfies the first threshold when the magnitude of the qualified load current change is less than the first threshold, and
wherein the second threshold is a positive threshold and the magnitude of the load current satisfies the second threshold when the magnitude of the load current is greater than the second threshold.

7. The gate driver system of claim 5, wherein the magnitude of the qualified load current change is based on a difference between averaged values of the load current, including a first averaged value of the load current determined at a most-recent sampling time and a second averaged value of the load current determined at a previous sampling time, and
wherein the magnitude of the load current is the first averaged value of the load current.

8. The gate driver system of claim 6, wherein the first threshold is a fixed threshold and the second threshold is a dynamic threshold, and
wherein the active thermal control circuit is configured to dynamically set the second threshold equal to an averaged value of the load current sampled at a trigger time at which an enabling of the active thermal control is triggered by the active thermal control circuit.

9. The gate driver system of claim 2, wherein the active thermal control circuit comprises:
a current sensor configured to sense the load current and generate a sensor signal representative of the load current;
a low-pass filter configured to receive the sensor signal and filter out load current change components of the sensor signal that do not satisfy the duration threshold and output load current change components of the sensor signal that satisfy the duration threshold as the qualified load current changes;
a high-pass filter coupled to an output of the low-pass filter and configured to output a polarity and the magnitude of the qualified load current change, wherein the polarity is indicative of the direction of the qualified load current change; and
a comparator network coupled to an output of the high-pass filter and configured to enable the active thermal control of the transistor if the qualified load current change has the decreasing direction and the magnitude of the qualified load current change satisfies the first threshold, and to disable the active thermal control of the transistor if the qualified load current change has the increasing direction and the magnitude of the qualified load current change satisfies the second threshold.

10. The gate driver system of claim 2, wherein the active thermal control circuit comprises:
a current sensor configured to sense the load current and generate a sensor signal representative of the load current;
an analog-to-digital converter (ADC) configured to convert the sensor signal into a digital signal; and
an evaluation circuit configured to receive the digital signal, determine an average current value of the digital signal, determine a difference value between a most-recent average current value and a previous average current value acquired prior to the most-recent average current value, wherein the difference value is the magnitude of the qualified load current change and a polarity of the difference value is indicative of the direction of a qualified load current change.

11. The gate driver system of claim 10, wherein the evaluation circuit is configured to compare the difference value to the first threshold and the second threshold, and enable or disable the active thermal control of the transistor based on the difference value satisfying the first threshold or the second threshold.

12. The gate driver system of claim 1, wherein the power dissipation parameter is a gate drive resistance coupled to the control terminal, a gate drive voltage applied to the control terminal during the conduction state, a switching frequency of the transistor, or a pulse-width modulation (PWM) scheme of the gate drive voltage applied to the control terminal to drive the switching states.

13. A gate driver system, comprising:
a gate driver configured to be coupled to a control terminal of a transistor and configured to control a control voltage applied to the control terminal in order to drive the transistor between switching states; and
an active thermal control circuit configured to monitor a load current conducted by the transistor in a conduction state, and enable or disable an active thermal control of the transistor based on the load current,
wherein the active thermal control circuit is configured to determine an average load current of the load current and evaluate load current changes of the average load current, wherein evaluating the load current changes of the average load current includes:
detecting a direction of a load current change of the average load current, wherein the direction of the load current change is an increasing direction or a decreasing direction,
detecting a magnitude of the load current change of the average load current, and
comparing the magnitude of the load current change to a first threshold, wherein, the active thermal control circuit is configured to enable the active thermal control of the transistor if the load current change has the decreasing direction and the magnitude of the load current change satisfies the first threshold, wherein, the active thermal control circuit is configured to, while the active thermal control is enabled, regulate a power dissipation parameter to regulate a power dissipation of the transistor, and wherein, while the active thermal control is disabled, the active thermal control circuit is configured to not regulate the power dissipation parameter.

14. The gate driver system of claim 13, wherein the active thermal control circuit is configured to compare the magnitude of the load current change to a second threshold, and wherein, the active thermal control circuit is configured to disable the active thermal control of the transistor if the load current change has the increasing direction and the magnitude of the load current change satisfies the second threshold.

15. The gate driver system of claim 13, wherein the active thermal control circuit is configured to compare a magnitude of the average load current to a second threshold, and wherein the active thermal control circuit is configured to disable the active thermal control of the transistor if the load current change has the increasing direction and the magnitude of the average load current satisfies the second threshold.

16. The gate driver system of claim 13, wherein the active thermal control circuit is configured to regulate the power dissipation parameter by setting the power dissipation parameter in a high-loss mode or a low-loss mode.

17. The gate driver system of claim 16, wherein, the active thermal control circuit is configured to, while the active thermal control is enabled, regulate the power dissipation parameter according to a duty cycle of the power dissipation parameter during which the active thermal control circuit switches the power dissipation parameter between the high-loss mode and the low-loss mode to regulate the power dissipation of the transistor.

18. The gate driver system of claim 17, wherein the active thermal control circuit is configured to receive an ambient temperature and the average load current as inputs, and wherein the active thermal control circuit is configured to, while the active thermal control is enabled, regulate the duty cycle of the power dissipation parameter according to a characteristic curve based on the ambient temperature and the average load current.

19. The gate driver system of claim 18, wherein the active thermal control circuit is configured to select the characteristic curve from a plurality of characteristic curves stored in a memory associated with the active thermal control circuit based on a load current index value, wherein the load current index value is a value of a most-recent sample of the average load current that results in an enabling of the active thermal control being triggered by the active thermal control circuit.

20. The gate driver system of claim 17, wherein the power dissipation parameter is a gate drive resistance coupled to the control terminal, a gate drive voltage applied to the control terminal during the conduction state, a switching frequency of the transistor, or a pulse-width modulation (PWM) scheme of the gate drive voltage applied to the control terminal to drive the switching states.

21. A method of driving a transistor between switching states, comprising:
monitoring load current changes of a load current conducted by the transistor in a conduction state;
enabling or disabling an active thermal control of the transistor based on the load current changes;
evaluating load current changes that satisfy a duration threshold as qualified load current changes;
detecting a direction of a qualified load current change of the qualified load current changes, wherein the direction of the qualified load current change is an increasing direction or a decreasing direction;
detecting a magnitude of the qualified load current change of the qualified load current changes;
comparing the magnitude to a first threshold; and
enabling the active thermal control of the transistor if the qualified load current change has the decreasing direction and the magnitude of the qualified load current change satisfies the first threshold,
wherein, while the active thermal control is enabled, an active thermal control circuit is enabled to regulate a power dissipation parameter to regulate a power dissipation of the transistor, and
wherein, while the active thermal control is disabled, the active thermal control circuit is disabled such that the power dissipation parameter is not regulated by the active thermal control circuit.

* * * * *